(12) United States Patent
Wang et al.

(10) Patent No.: US 10,504,898 B2
(45) Date of Patent: Dec. 10, 2019

(54) FIN FIELD-EFFECT TRANSISTOR STRUCTURE AND METHOD FOR FORMING THE SAME

(71) Applicant: Taiwan Semiconductor Manufacturing Co., Ltd., Hsinchu (TW)

(72) Inventors: Yin Wang, New Taipei (TW);
Chien-Chih Lin, Taichung (TW);
Chien-Tai Chan, Hsinchu (TW);
Wei-Ken Lin, Tainan (TW); Chun-Te Li, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

(21) Appl. No.: 15/688,478

(22) Filed: Aug. 28, 2017

(65) Prior Publication Data

US 2019/0067283 A1    Feb. 28, 2019

(51) Int. Cl.
| | |
|---|---|
| *H01L 21/70* | (2006.01) |
| *H01L 27/092* | (2006.01) |
| *H01L 21/8238* | (2006.01) |
| *H01L 21/324* | (2006.01) |
| *H01L 29/417* | (2006.01) |
| *H01L 21/84* | (2006.01) |
| *H01L 27/12* | (2006.01) |

(52) U.S. Cl.
CPC ........ *H01L 27/0924* (2013.01); *H01L 21/324* (2013.01); *H01L 21/823821* (2013.01); *H01L 21/823878* (2013.01); *H01L 21/845* (2013.01); *H01L 27/1211* (2013.01); *H01L 29/41791* (2013.01)

(58) Field of Classification Search
USPC ....... 257/57, 59, 72, 83, 257, 290, 351, 368, 257/392, 66; 438/30, 48, 128, 149, 151, 438/157, 161, 283
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |

(Continued)

*Primary Examiner* — Niki H Nguyen
(74) *Attorney, Agent, or Firm* — Birch, Stewart, Kolasch & Birch, LLP

(57) ABSTRACT

A fin field-effect transistor (FinFET) structure and a method for forming the same are provided. The FinFET structure includes a first fin structure that protrudes from a first region of a substrate. A second fin structure protrudes from a second region of the substrate. Isolation regions cover lower portions of the first fin structure and the second fin structure and leave upper portions of the first fin structure and the second fin structure above the isolation regions. A first liner layer is positioned between the lower portion of the first fin structure and the isolation regions in the first region. A second liner layer covers the lower portion of the second fin structure and is positioned between the second fin structure and the isolation regions in the second region. The first liner layer and the second liner layer are formed of different materials.

20 Claims, 20 Drawing Sheets

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,679,819 B1 * | 6/2017 | Tung ............... H01L 21/823821 |
| 2016/0233088 A1 * | 8/2016 | Feng ................... H01L 21/2256 |
| 2017/0069630 A1 * | 3/2017 | Cha .................... H01L 27/0924 |
| 2018/0308933 A1 * | 10/2018 | Tung .................... H01L 29/785 |

* cited by examiner

FIN FIELD-EFFECT TRANSISTOR STRUCTURE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
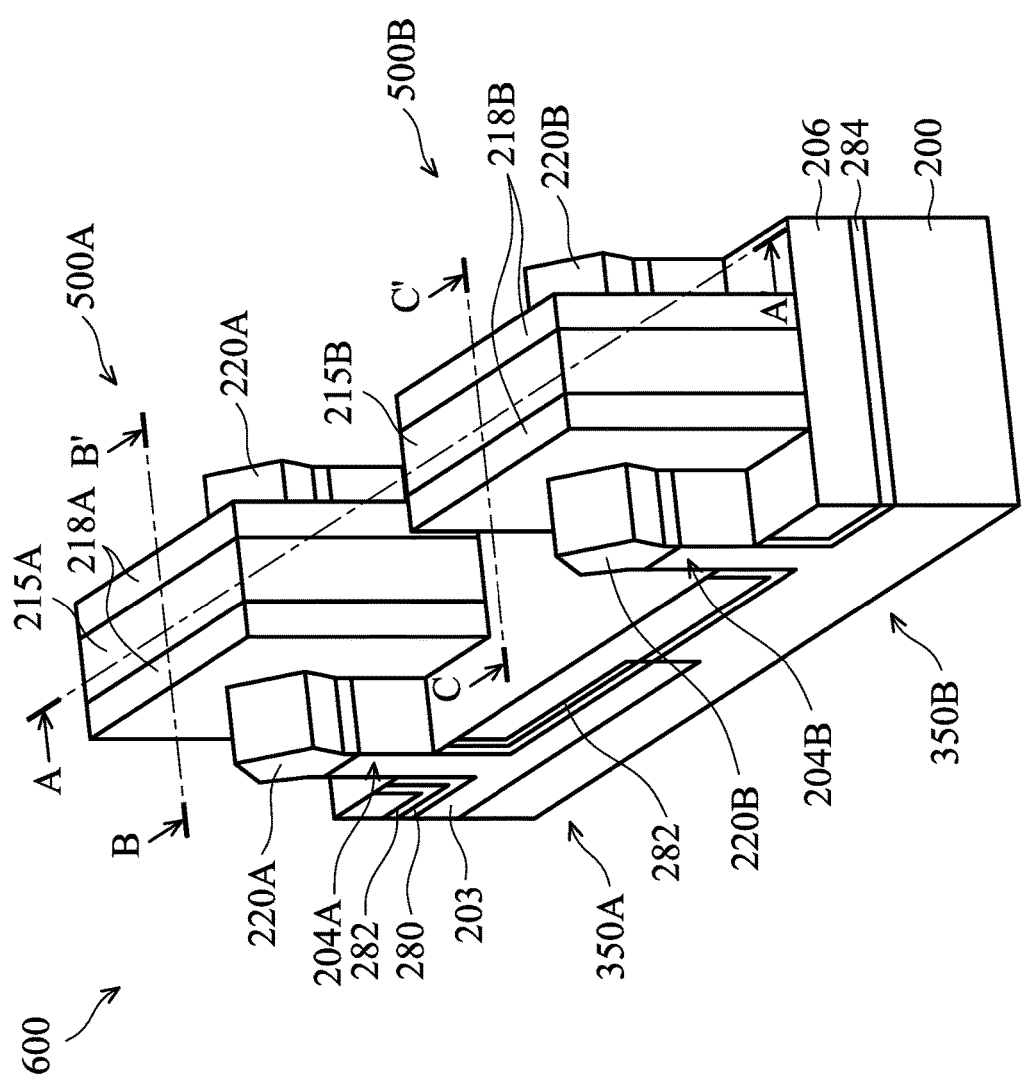
FIG. 1 is a perspective view of a fin field-effect transistor (FinFET) structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Figure 16:
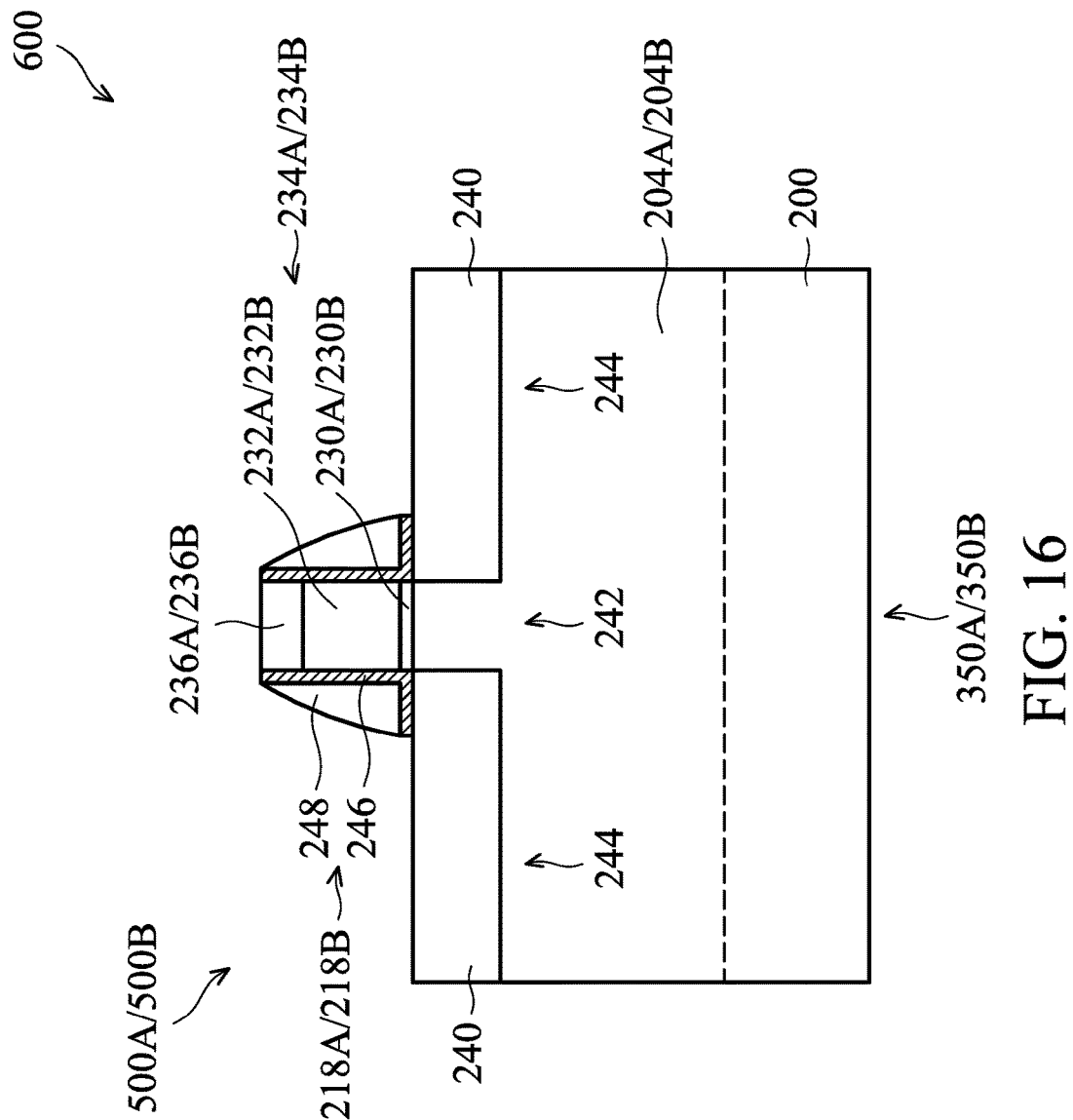
Figure 17:
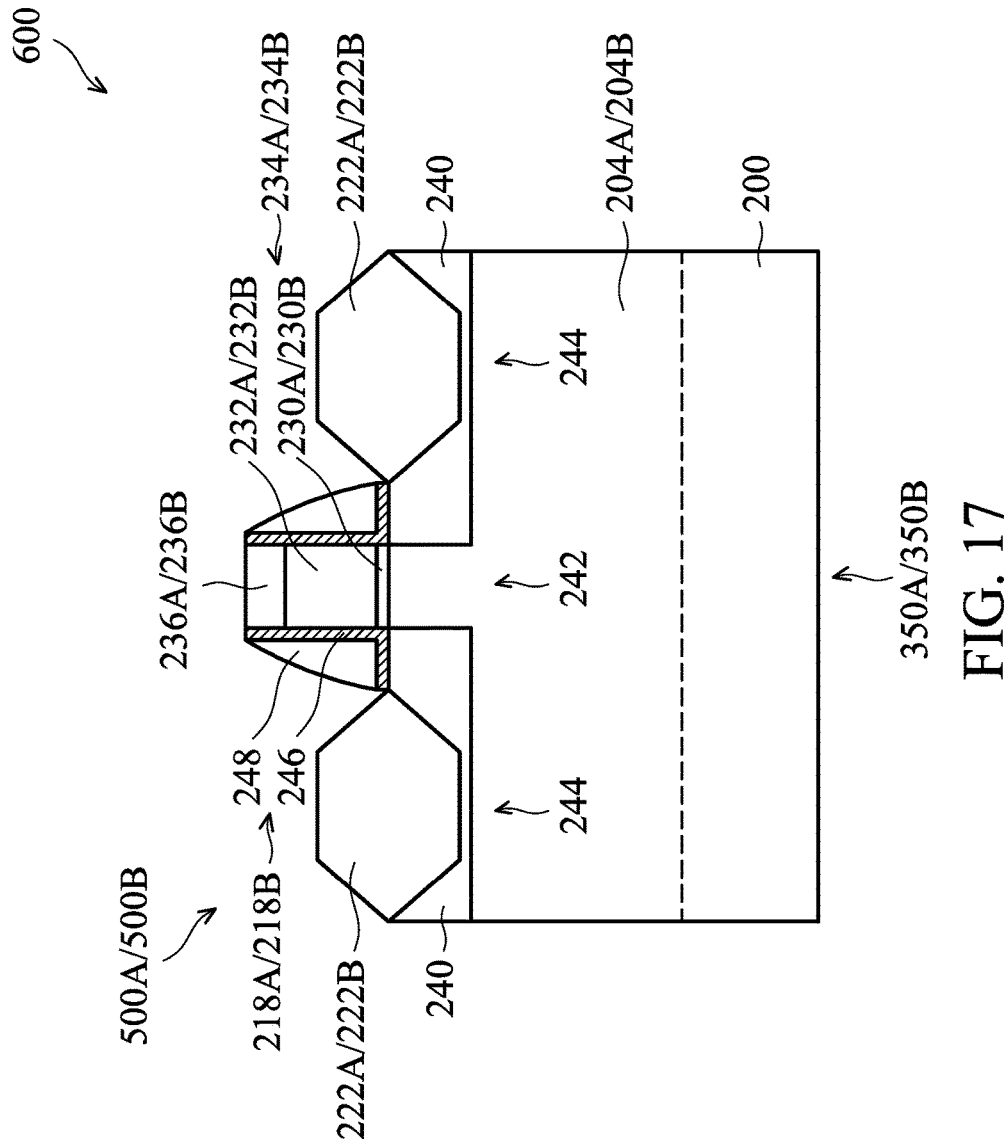
Figure 18:
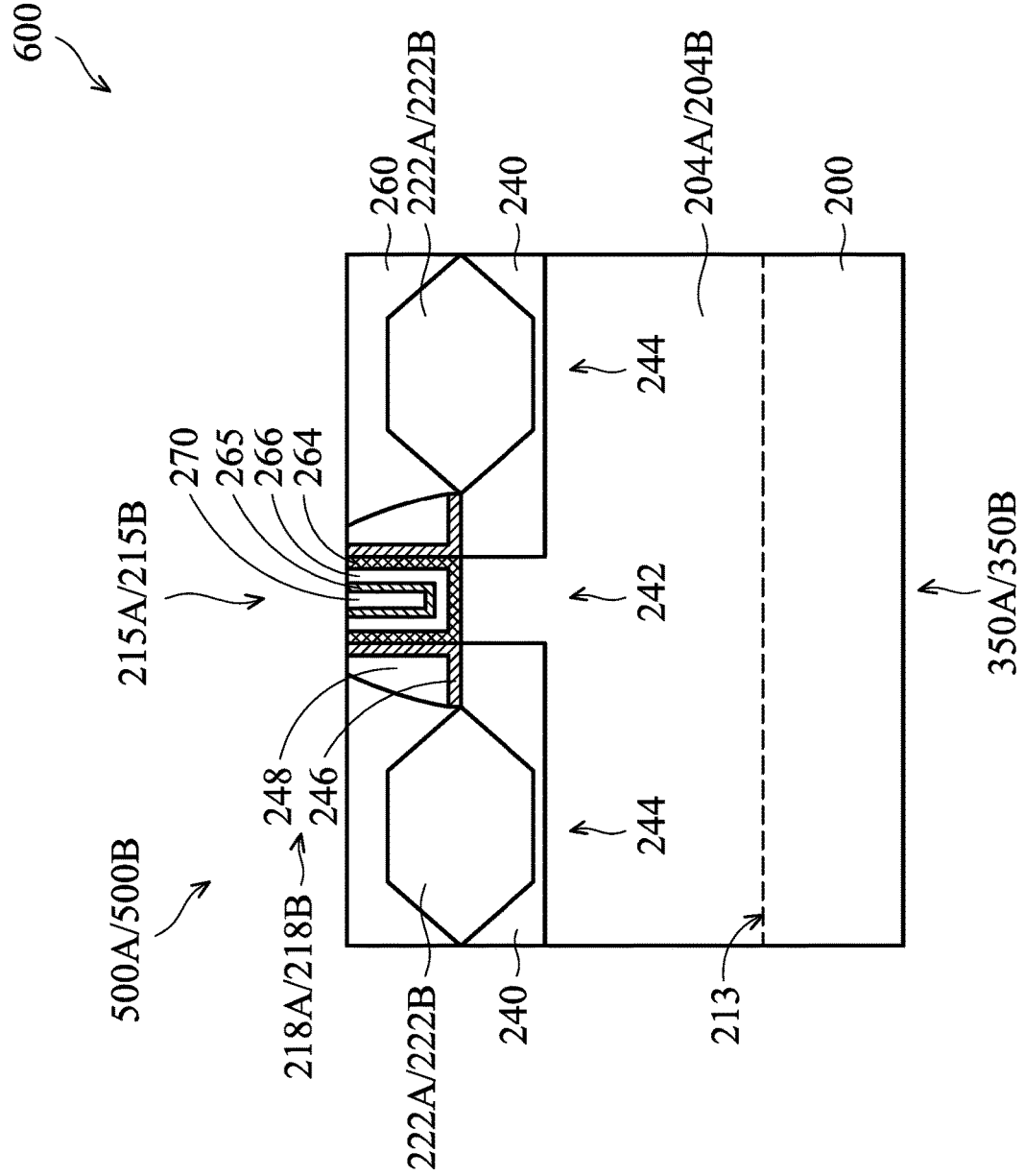
Figure 19A:
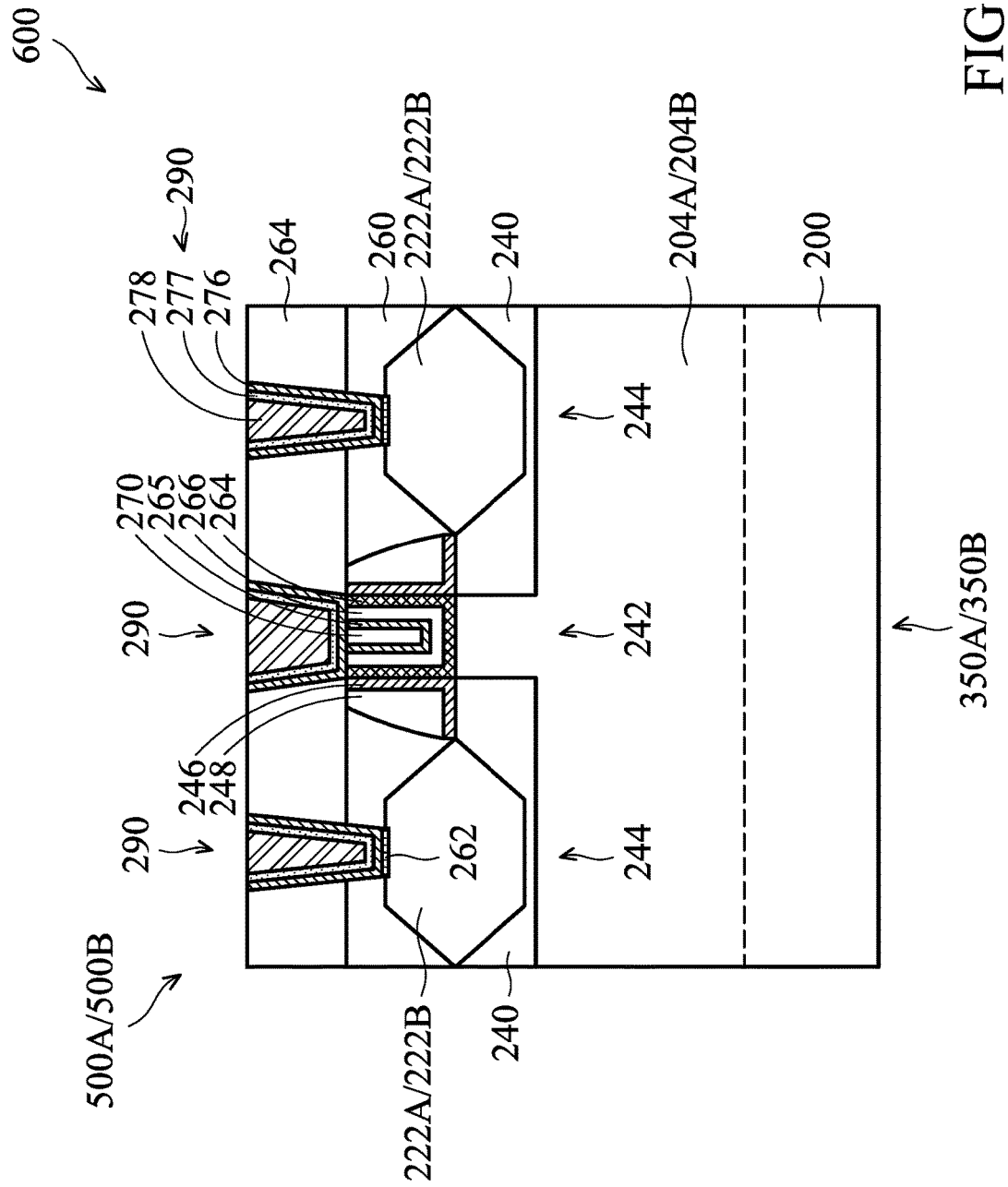
FIG. 19A is a cross-sectional view along line B-B' of FIG. 1 showing a stage of a method of forming a FinFET structure after performing the stage shown in FIG. 18, in accordance with some embodiments.
Figure 19B:
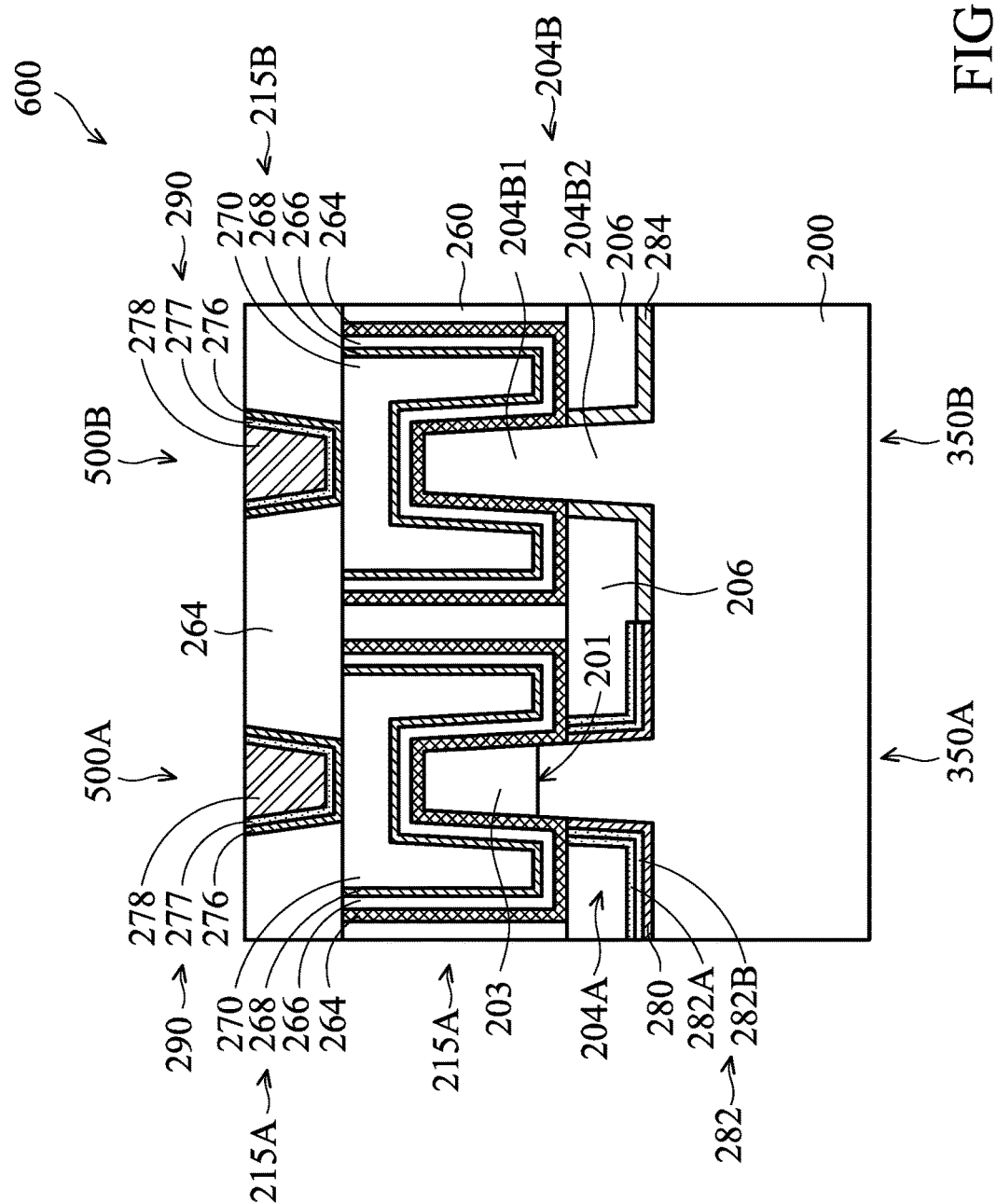
FIG. 19B is a cross-sectional view along line C-C' of FIG. 1 showing a stage of a method of forming a FinFET structure after performing the stage shown in FIG. 18, in accordance with some embodiments.

Embodiments of a semiconductor structure and a method for forming the same are provided. FIG. 1 is a perspective view of a fin field-effect transistor (FinFET) structure 600 including FinFETs 500A and 500B in accordance with some embodiments. FIGS. 2-15 are cross-sectional views along line A-A' of FIG. 1 to show various stages of a process for forming the FinFET structure 600, in accordance with some embodiments. FIGS. 16-18 are cross-sectional views along line B-B' or line C-C' of FIG. 1 to show various stages of a process for forming the FinFET structure 600 after performing the stage shown in FIG. 15. FIGS. 19A and 19B are cross-sectional views along line B-B' and line C-C' of FIG. 1 to show a stage of a process for forming the FinFETs 500A and 500B of the FinFET structure 600 after performing the stage shown in FIG. 18. In some embodiments, a gate-replacement process is employed to fabricate the FinFET structure 600.

FIG. 1 is a perspective view of a fin field-effect transistor (FinFET) structure 600 in accordance with some embodiments. The FinFET structure 600 includes a substrate 200 having a first region 350A (e.g. a P-type FinFET region) for a FinFET 500A formed thereon and a second region 350B (e.g. an N-type FinFET region) for a FinFET 500B formed thereon. In some embodiments, the first region 350A of the substrate 200 includes a semiconductor material (e.g. silicon germanium) 203 that is different from the substrate 200 (e.g. silicon).

In some embodiments, a fin structure 204A formed of the semiconductor material 203 may be formed protruding from the first region 350A, and a fin structure 204B may be formed protruding from the second region 350B. Isolation regions 206 may be positioned on opposing sides of the fin structures 204A and 204B. In some embodiments, a liner layer 282 is positioned between a lower portion of the fin structure 204A and the isolation regions 206 in the first region 350A, and a liner layer 284 is positioned between a lower portion of the second fin structure 204B and the isolation regions 206 in the second region 350B.

A gate structure 215A is positioned on the fin structure 204A in the first region 350A. Similarly, a gate structure 215B is positioned on the fin structure 204B in the second region 350B. Each of the gate structures 215A and 215B may include a gate dielectric layer, a barrier layer, a seed layer and a gate electrode. Gate spacers 218A may be formed on opposite sidewalls of the gate structure 215A and over the fin structure 204A. Similarly, gate spacers 218B may be formed on opposite sidewalls of the gate structure 215B and over the fin structure 204B. In addition, source/drain features 220A may be formed on outer sidewalls of the gate spacers 218A, and source/drain features 220B may be formed on outer sidewalls of the gate spacers 218B.

Figure 2:
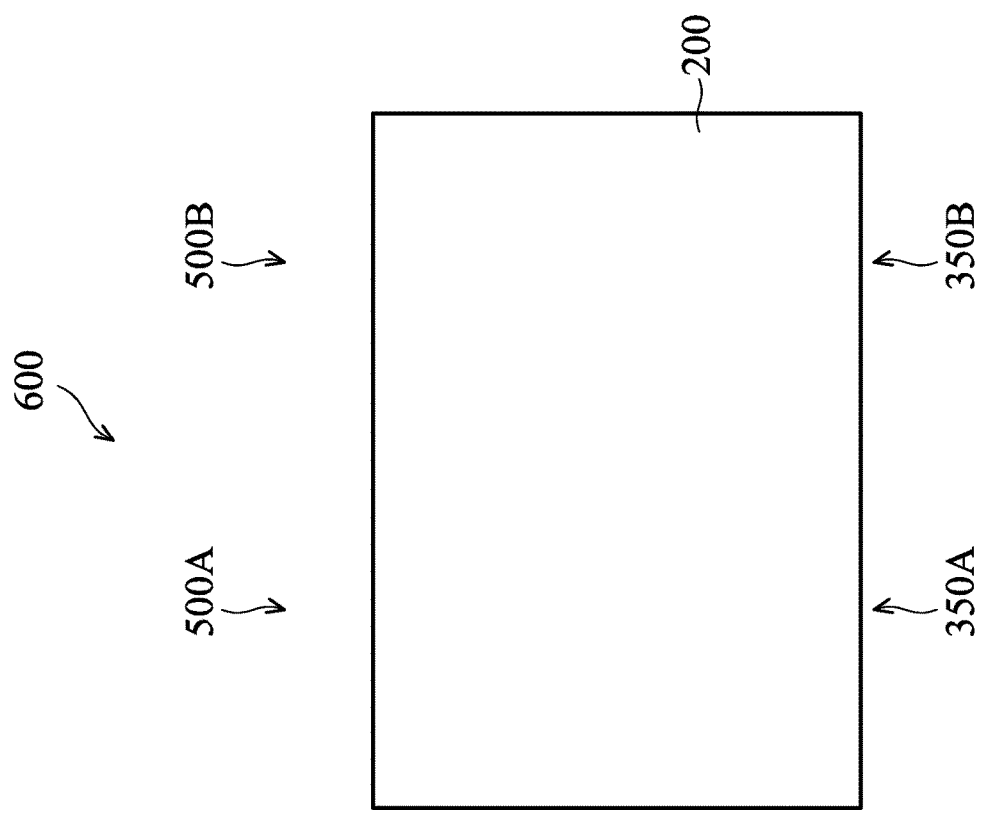
FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17 and FIG. 18 are cross-sectional views showing various stages of a method of forming a FinFET structure in accordance with some embodiments.

As shown in FIG. 2, a substrate 200 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 200 may include silicon.

In some embodiments, the substrate 200 has a first region 350A and a second region 350B adjacent to the first region 350A. The first region 350A may be for forming P-type devices, such as P-type metal-oxide-semiconductor field-effect transistors (MOSFETs) (e.g. the FinFET 500A). The second region 350B may be for forming N-type devices, such as N-type metal-oxide-semiconductor field-effect transistors (MOSFETs) (e.g. the FinFET 500B). Therefore, the first region 350A may be referred to as a PMOS region, and the second region 350B may be referred to as an NMOS region. In some other embodiments, P-type devices (or N-type devices) are formed in both the first region 350A and the second region 350B.

Figure 3:
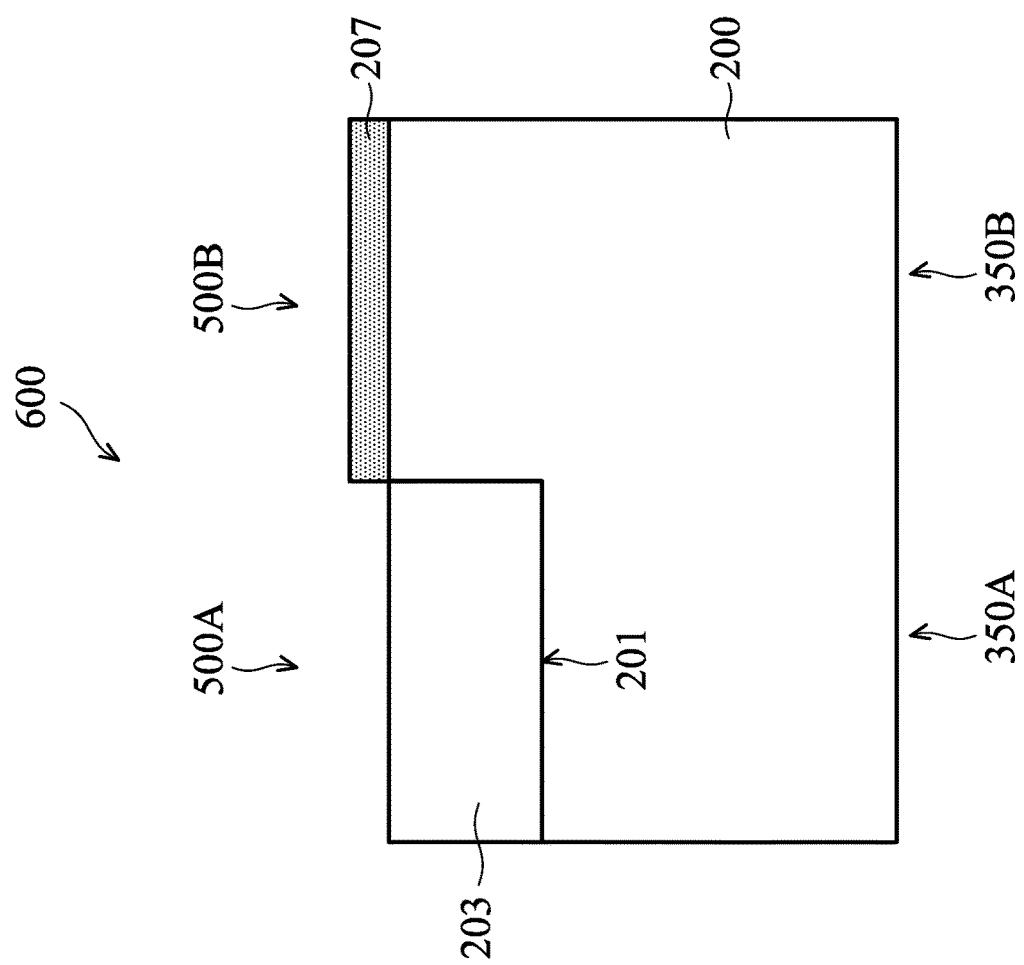

Afterwards, a portion of the substrate 200 including silicon in the first region 350A is removed while a mask layer 207 covers the second region 350B, as shown in FIG. 3 in accordance with some embodiments. The mask layer 207, which may be a photo-sensitive layer such as photoresist, may be formed over the substrate 200 using a deposition process, such as chemical vapor deposition (CVD), physical vapor deposition (PVD) or spin coating, a photolithography and a patterning processes. The substrate 200 in the first region 350A and exposed from the mask layer 207 is then removed by a suitable etching process, such as reactive ion etch (RIE), neutral beam etch (NBE), the like, or a combination thereof, to form a recess (not shown) in the first region 350A.

Afterwards, a semiconductor material 203 including silicon germanium is epitaxial grown in the recess in the first region 350A by an epitaxially growing process, as shown in FIG. 3 in accordance with some embodiments. After forming the semiconductor material 203, the mask layer 207 may be removed by a suitable removal process, such as etching or plasma ashing. A planarization process, such as chemical mechanical polish (CMP), may then be performed to level the top surface of the semiconductor material 203 with the top surface of the substrate 200. FIG. 3 also shows an interface 201 between the semiconductor material 203 and the substrate 200, which may or may not be a straight line as illustrated in FIG. 3.

Figure 4:
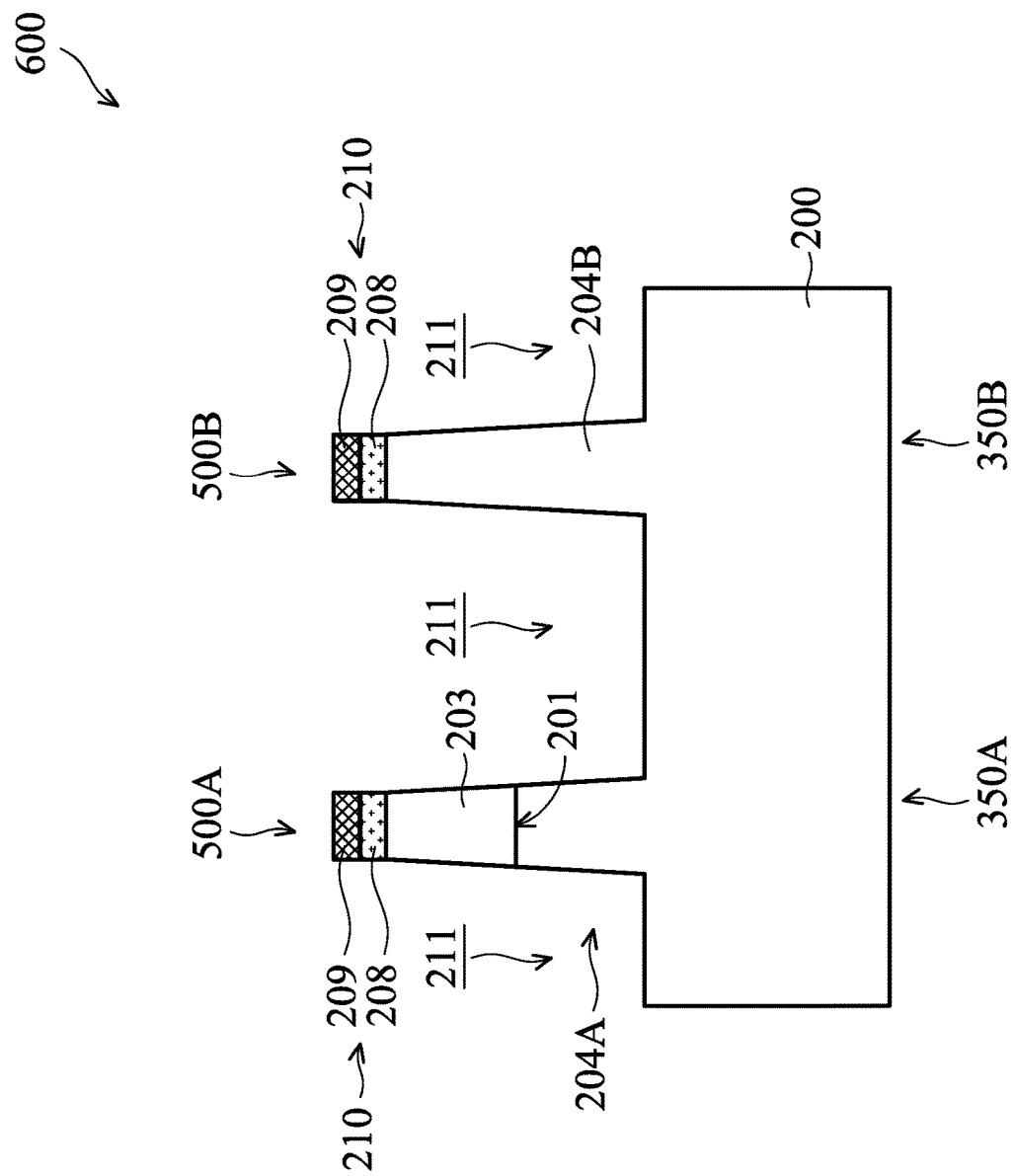

Afterwards, a first fin structure 204A is formed in the first region 350A of the substrate 200 and a second fin structure 204B is formed in the second region 350B of the substrate 200 by a patterning process, as shown in FIG. 4 in accordance with some embodiments. The first fin structure 204A may be composed by a portion of the semiconductor material 203 (above the interface 201) and a portion of the substrate 200 (below the interface 201) and protrudes from the substrate 200 in the first region 350A. The second fin structure 204B is a portion of the substrate 200 and protrudes from the substrate 200 in the second region 350B. In some embodiments, the first fin structure 204A and the second fin structure 204B are formed by a patterning process using patterned masks 210 as etch masks. For example, each of the patterned masks 210 includes patterned pad oxide 208 and patterned pad nitride 209, are formed over the substrate 200 in the first region 350A and the second region 350B. The patterned pad oxide 208 may be formed of silicon oxide using a thermal oxidation process. The patterned pad nitride 209 may act as an adhesion layer pattern between the substrate 200 and the underlying patterned pad oxide 208. In some embodiments, the patterned pad nitride 209 is formed of silicon nitride, silicon oxynitride, silicon carbide, silicon carbonitride, the like, or a combination thereof, and may be formed using a low-pressure chemical vapor deposition (LPCVD) process or a plasma enhanced chemical vapor deposition (PECVD) process, as examples.

Afterwards, the semiconductor material 203 in the first region 350A and the substrate 200 in the first region 350A and the second region 350B, which are not covered by the patterned masks 210, are removed to form trenches 211 by an etching process. Therefore, the fin structure 204A is formed between the trenches 211 in the first region 350A. The fin structure 204B is formed between the trenches 211 in the second region 350B. In addition, bottoms of the trenches 211 may extend below the interface 201, so that the top half (above the interface 201) of the fin structure 204A may be formed of the semiconductor material 203 and the bottom half (below the interface 201) of the fin structure 204A may be formed of the material of the substrate 200. The fin structure 204B is formed entirely of the material of the substrate 200. In some embodiments, the etching process includes reactive ion etch (RIE), neutral beam etch (NBE), the like, or a combination thereof.

Figure 5:
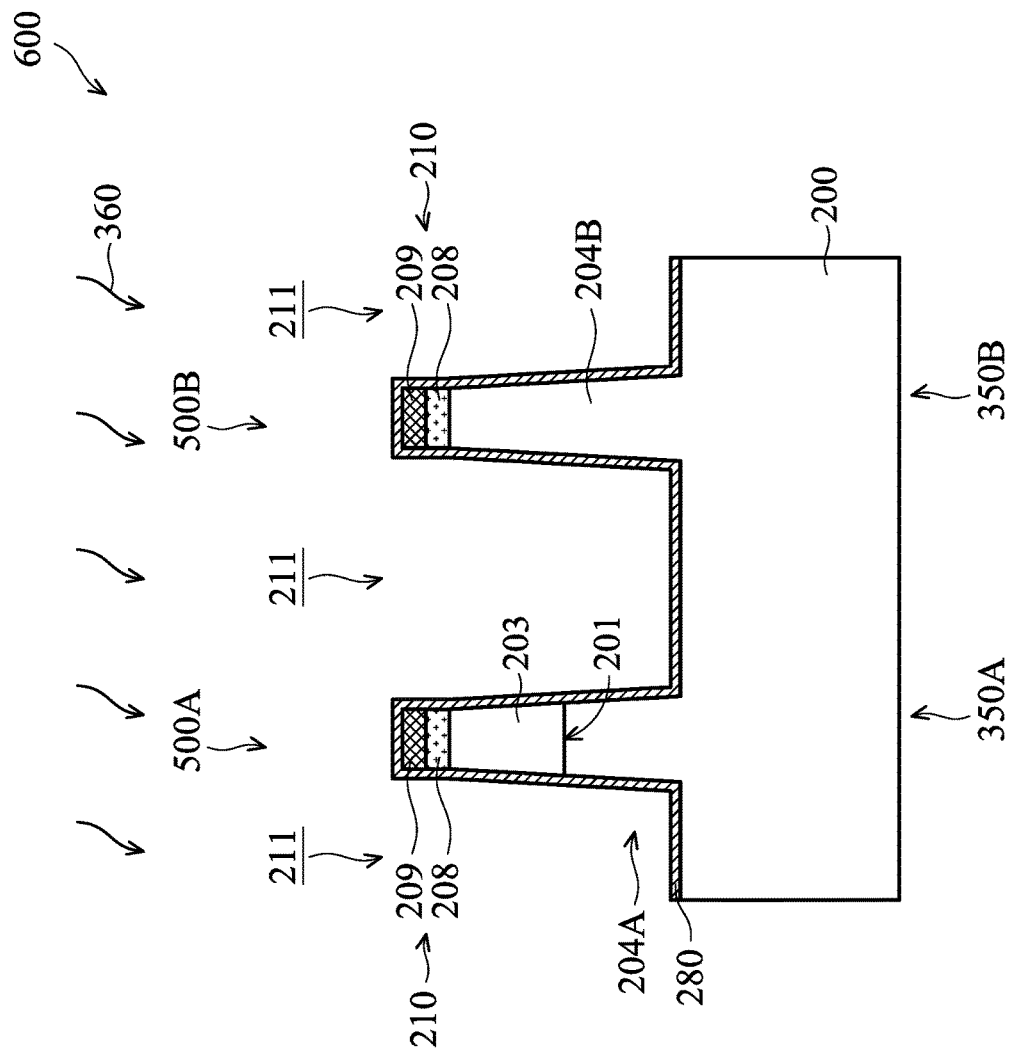

Afterwards, a semiconductor capping layer 280 is conformally formed over the fin structure 204A and the fin structure 204B, as shown in FIG. 5 in accordance with some embodiments. In addition, the semiconductor capping layer 280 is formed over the semiconductor material 203 in the first region 350A and the substrate 200 in the second region 350B. In some embodiments, the semiconductor capping layer 280 includes a layer of silicon, silicon oxide or silicon nitride, or multi layers including silicon oxide and silicon nitride. Therefore, the semiconductor capping layer 280 may also be referred to as a silicon liner. Any suitable deposition method, such as CVD, PVD, ALD, the like, or a combination thereof, may be used to form the semiconductor capping layer 280.

After the semiconductor capping layer 280 is formed, a nitridation treatment process 360 is performed on the semiconductor capping layer 280, as shown in FIG. 5 in accordance with some embodiments. The nitridation treatment process 360 is performed using a nitride-containing gas, such as ammonia (e.g. $NH_3$), in some embodiments. The nitridation treatment process 360 may convert a top layer (e.g. the exterior portion) of the semiconductor capping layer 280 into a nitride (e.g., silicon nitride), which nitride may prevent or reduce oxidation of the fin structure 204A and the fin structure 204B in an ambient atmosphere.

Figure 6:
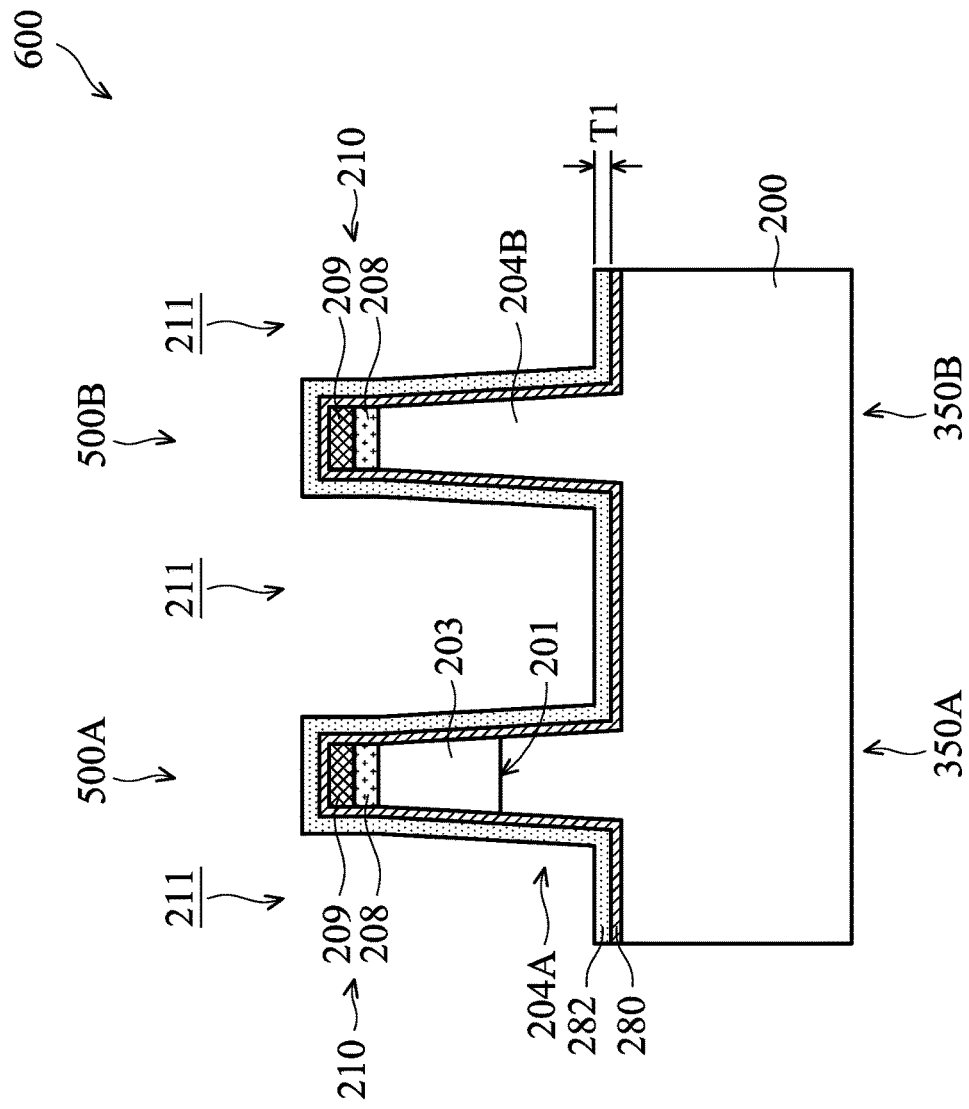

Afterwards, a liner layer 282 is conformally formed over the semiconductor capping layer 280 in the first region 350A and the second region 350B, as shown in FIG. 6 in accordance with some embodiments. The liner layer 282 may comprise suitable dielectric material that reduces or prevents oxidization of the fin structure. In some embodiments, the liner layer 282 is formed of a nitride-containing material. For example, the liner layer 282 may be a single layer formed of silicon nitride or silicon oxynitride (e.g., $SiN_x$, SiON) or a multi layers including a silicon oxide layer and a silicon nitride and/or silicon oxynitride layer. In some embodiments, the liner layer 282 is formed by a deposition process including CVD, PVD, ALD, the like, or a combination thereof. A thickness T1 of the liner layer 282 may be in a range from about 2 nm to about 4 nm.

Figure 7:
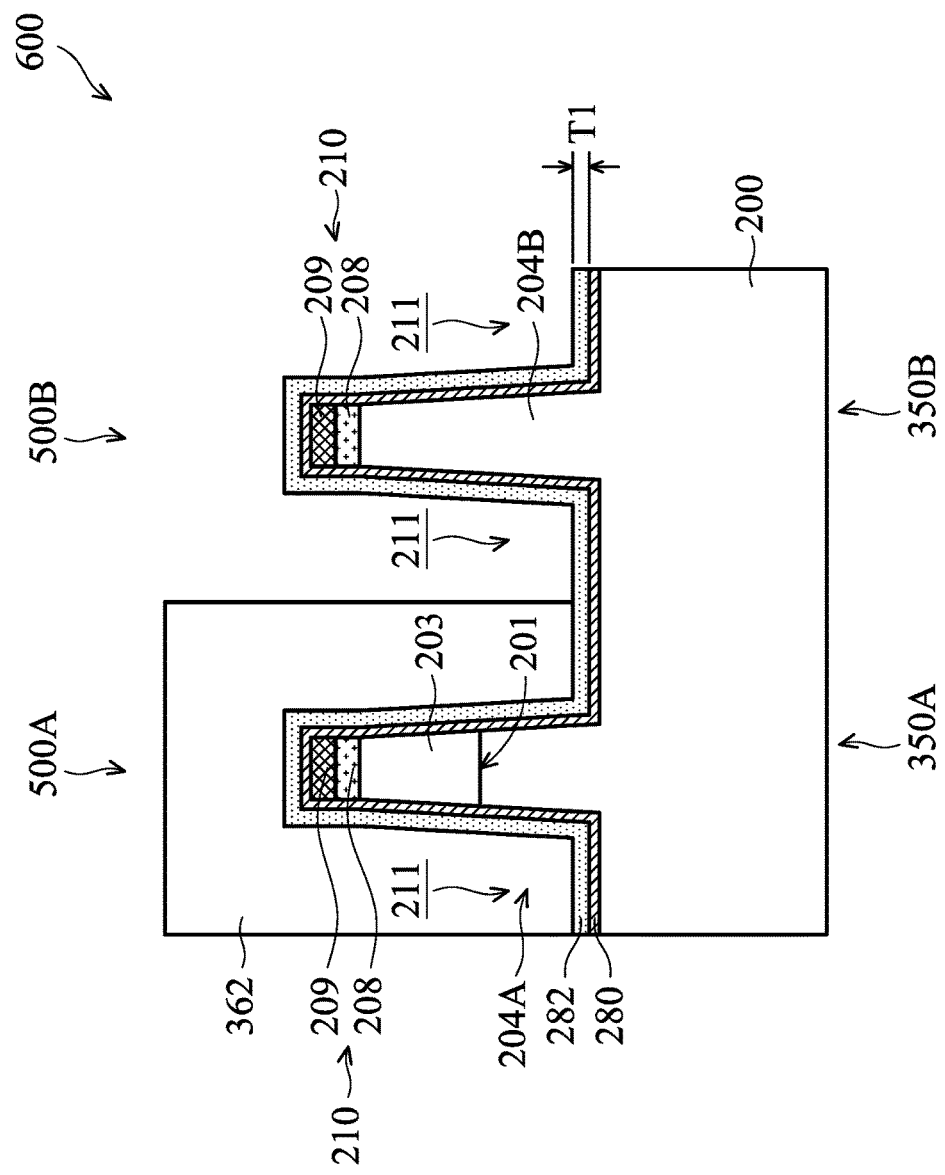

Afterwards, a mask layer 362, such as a photoresist (PR), is formed to cover the fin structure 204A and the semiconductor material 203 in the first region 350A, as shown in FIG. 7 in accordance with some embodiments. In some embodiments, the mask layer 362 is formed by a deposition process and a subsequent photolithography process. In some embodiments, the deposition process includes a spin-on process. In addition, the photolithography process includes photoresist coating (e.g. spin-on coating), soft baking, mask aligning, exposure, post-exposure baking, developing the photoresist, rinsing and drying (e.g. hard baking).

Figure 8:
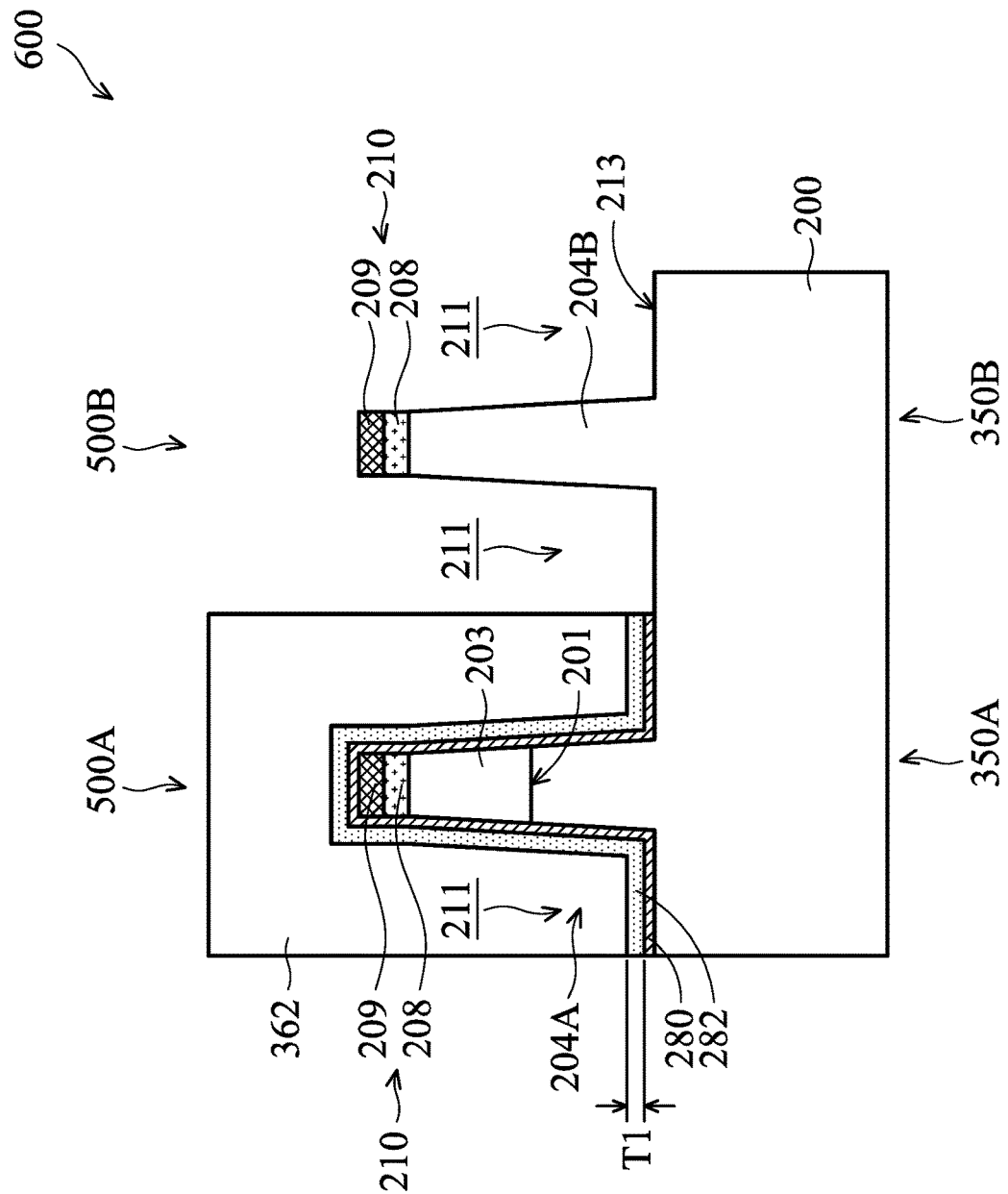

Afterwards, the semiconductor capping layer 280 and the liner layer 282 covering the fin structure 204B in the second region 350B are removed by an etching process, as shown in FIG. 8 in accordance with some embodiments. The etching process is performed until the fin structure 204B and bottom surfaces 213 of the trenches 211 in the second region 350B are exposed. In some embodiments, the etching process includes a wet etching process using phosphoric acid (e.g. $H_3PO_4$).

In some embodiments, the etching process is performed to remove the liner layer 282 covering the fin structure 204B in the second region 350B and leave the semiconductor capping layer 280 covering the fin structure 204B in the second region 350B. Therefore, the etching process may be performed until the semiconductor capping layer 280 in the second region 350B is exposed.

Figure 9:
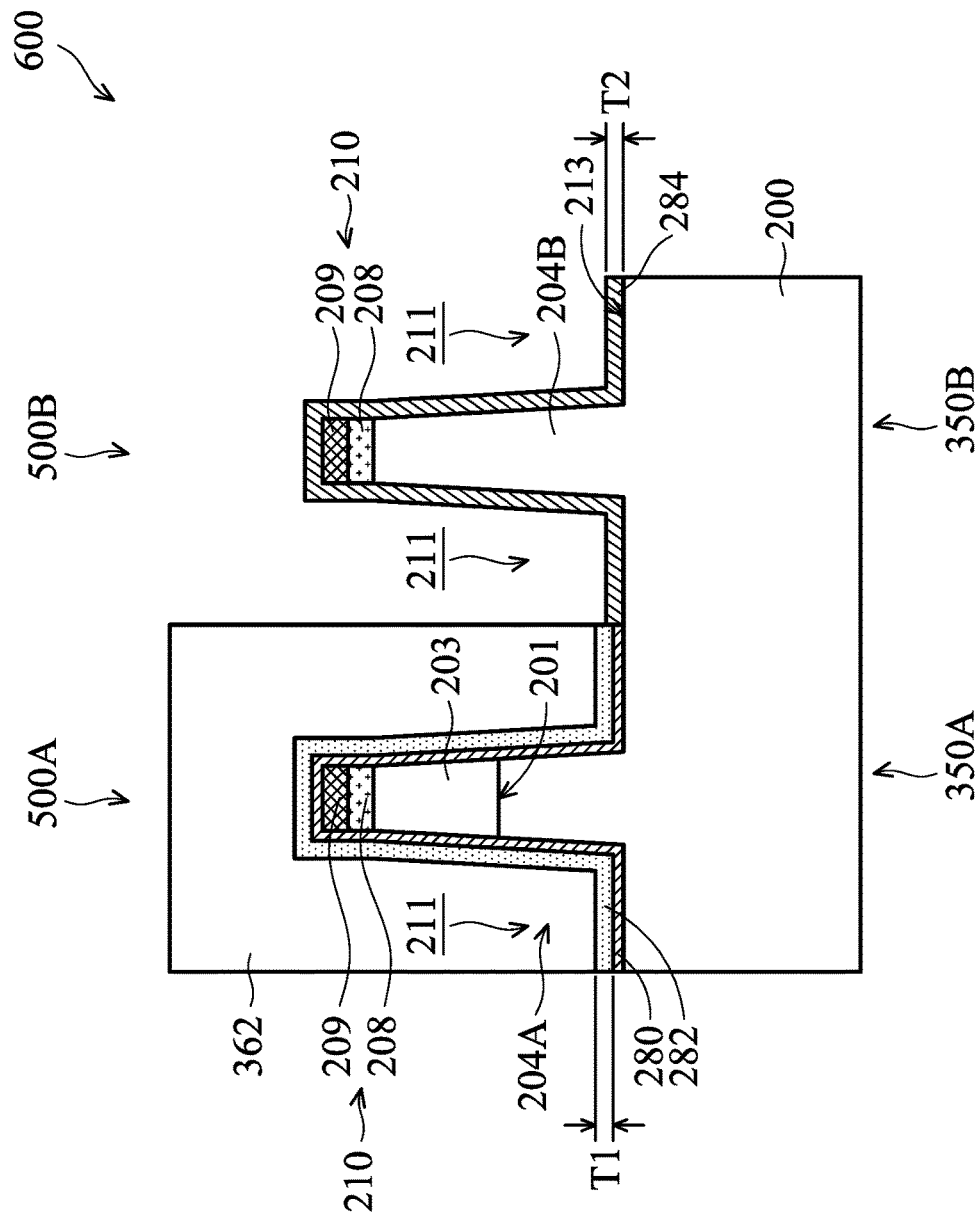

Afterwards, a liner layer 284 is conformally formed over the fin structure 204B in the second region 350B, as shown in FIG. 9 in accordance with some embodiments. The liner layer 284 may be in contact with sidewalls of the fin structure 204B and the bottom surfaces 213 of the trenches 211 in the in the second region 350B. In addition, the liner layer 282 does not overlap the liner layer 284 in the second region 350B. The liner layer 284 in the second region 350B (e.g. the NMOS region) may include a suitable dielectric material that has the reduced amount of positive charges. In some embodiments, the liner layer 284 is formed of an oxide-containing material formed by a thermal oxidation process or a deposition process, such as ALD. For example, the liner layer 284 may include silicon oxide ($SiO_2$) or phosphorus pentoxide ($P_2O_5$) or a combination thereof. In some embodiments, a thickness T2 of the liner layer 284 may be the same as the thickness T1 of the liner layer 282. For example, the thickness T2 of the liner layer 284 may be in a range from about 2 nm to about 4 nm.

Figure 10:
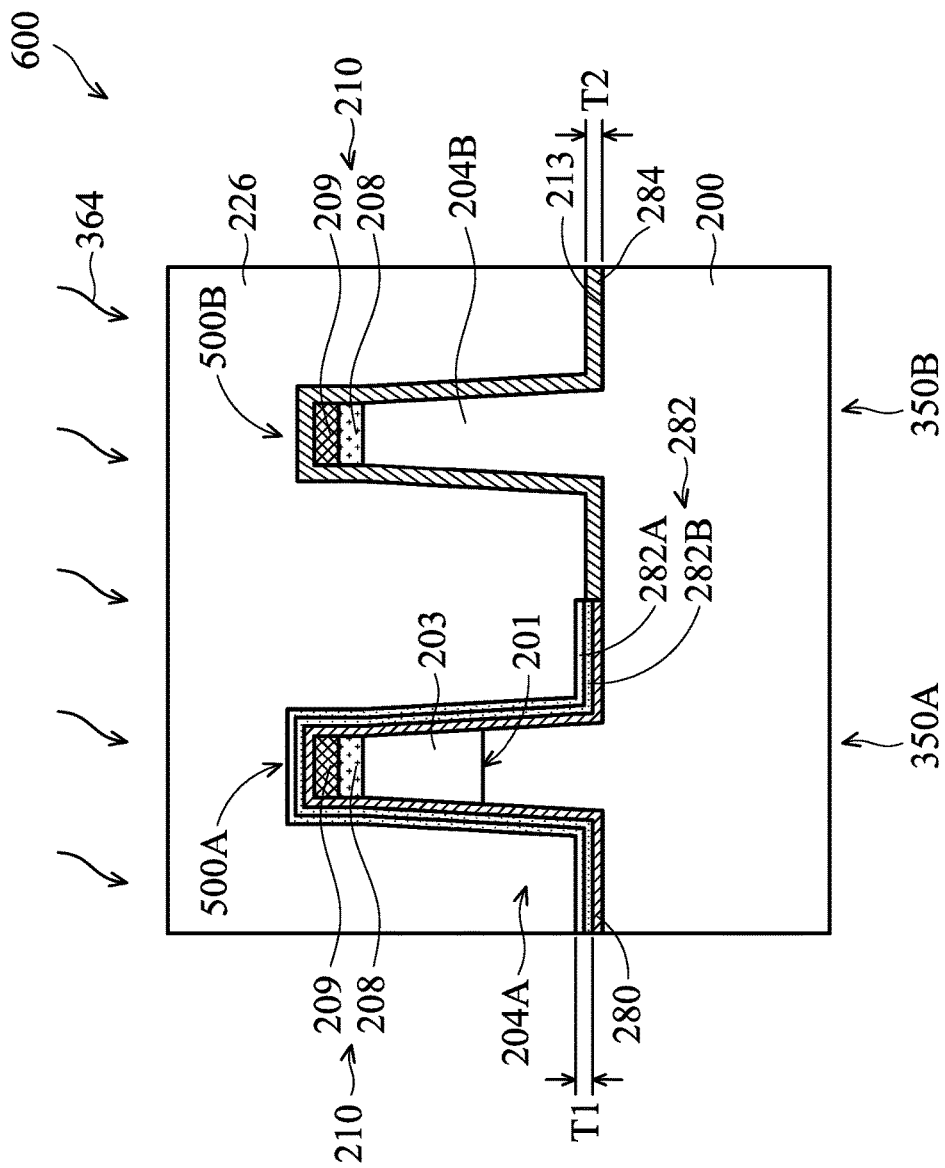

Afterwards, an insulation material 226 is entirely formed over the fin structures 204A and 204B, as shown in FIG. 10 in accordance with some embodiments. In addition, the insulation material 226 is formed to fill the trenches 211 (FIG. 9), cover top surfaces of the fin structures 204A and 204B, and cover the liner layer 282 and the liner layer 284 in the first region 350A and the second region 350B. The insulation material 226 may be formed of oxide, such as silicon oxide, a nitride, the like, or a combination thereof, and may be formed by high density plasma chemical vapor deposition (HDP-CVD), flowable CVD (FCVD), the like, or a combination thereof. Other insulation materials and/or other formation processes may be used.

After the insulation material 226 is formed, an anneal process 364 is performed to cure the insulation material 226, as shown in FIG. 10 in accordance with some embodiments. The anneal process 364 may include a wet anneal process, such as a wet steam anneal, and a subsequent dry anneal process. In some embodiments, the wet anneal process is a wet steam anneal (e.g. a thermal anneal process performed in an environment including water steam) performed at a temperature in a range from about 500° C. to about 700° C., for a duration of about two hours to about three hours. In addition, the dry anneal process is performed in an ambient atmosphere comprising nitrogen (e.g. $N_2$ gas), at a temperature in a range from about 600° C. to about 800° C., for a duration of about one hour to about two hours.

In some embodiments, the top (exterior) portion 282A of the liner layer 282 is oxidized by, e.g. oxygen comes from the wet steam used during the anneal process 364, and is converted into an oxide of a material of the liner layer 282. Therefore, the top portion 282A of the liner layer 282 is oxidized more than a bottom portion 282B of the liner layer 282, which is further away from the oxygen comes from the wet steam. In some embodiments, the bottom portion 282B of the liner layer 282 comprises silicon nitride, the top portion 282A of the liner layer 282 comprises silicon oxynitride.

Figure 11:
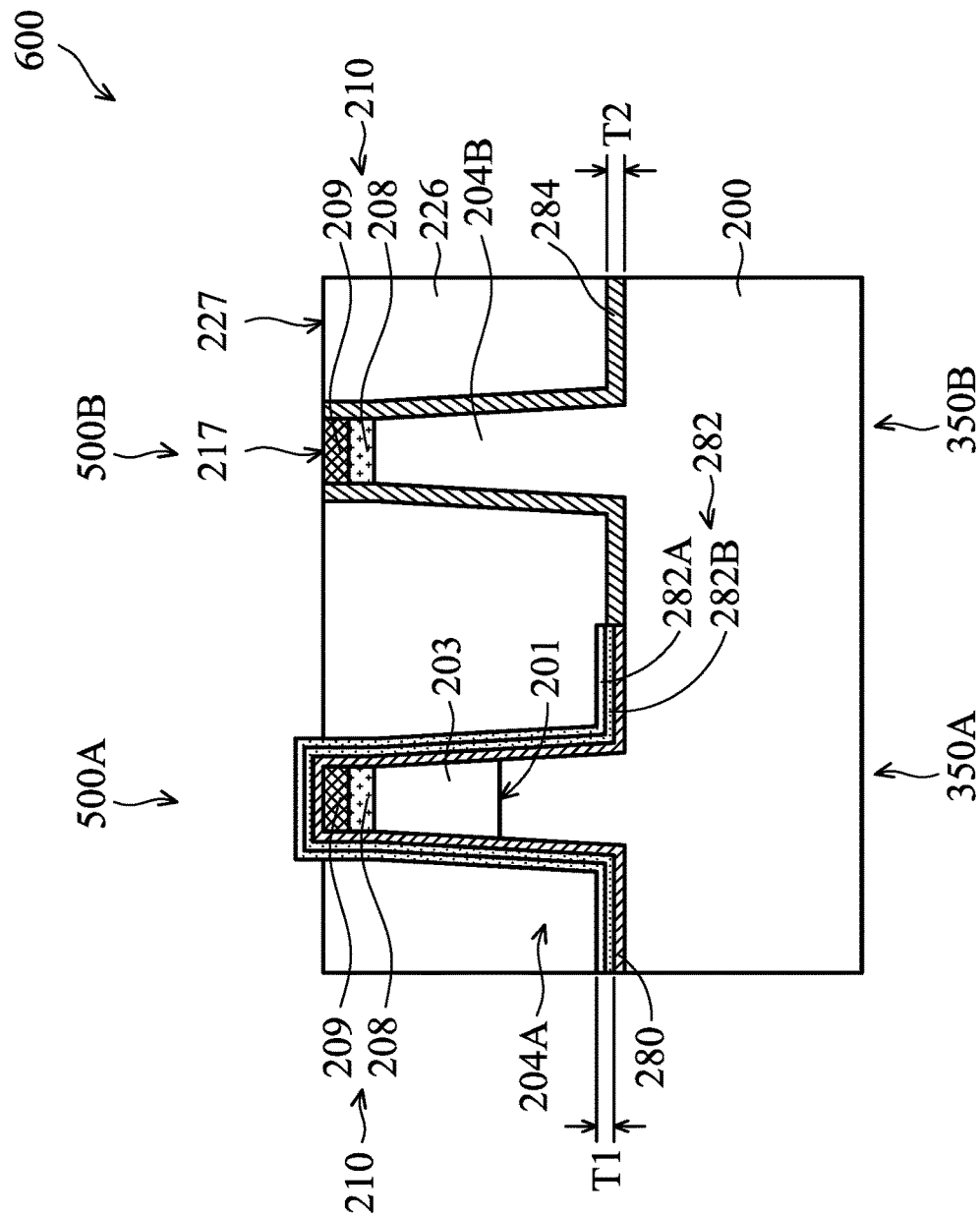

Afterwards, the insulation material 364 and the liner layer 284 over the top surfaces of the fin structures 204A and 204B are removed by a planarization process, as shown in FIG. 11 in accordance with some embodiments. The planarization process, such as CMP, is performed until the liner layer 282 in the first region 350A and a top surface 217 of the patterned mask 210 in the second region 350B is exposed. After performing the planarization process, a top surface 227 of the insulation material 364 is aligned the top surfaces 217 of the patterned masks 210 in the second region 350B.

Figure 12:
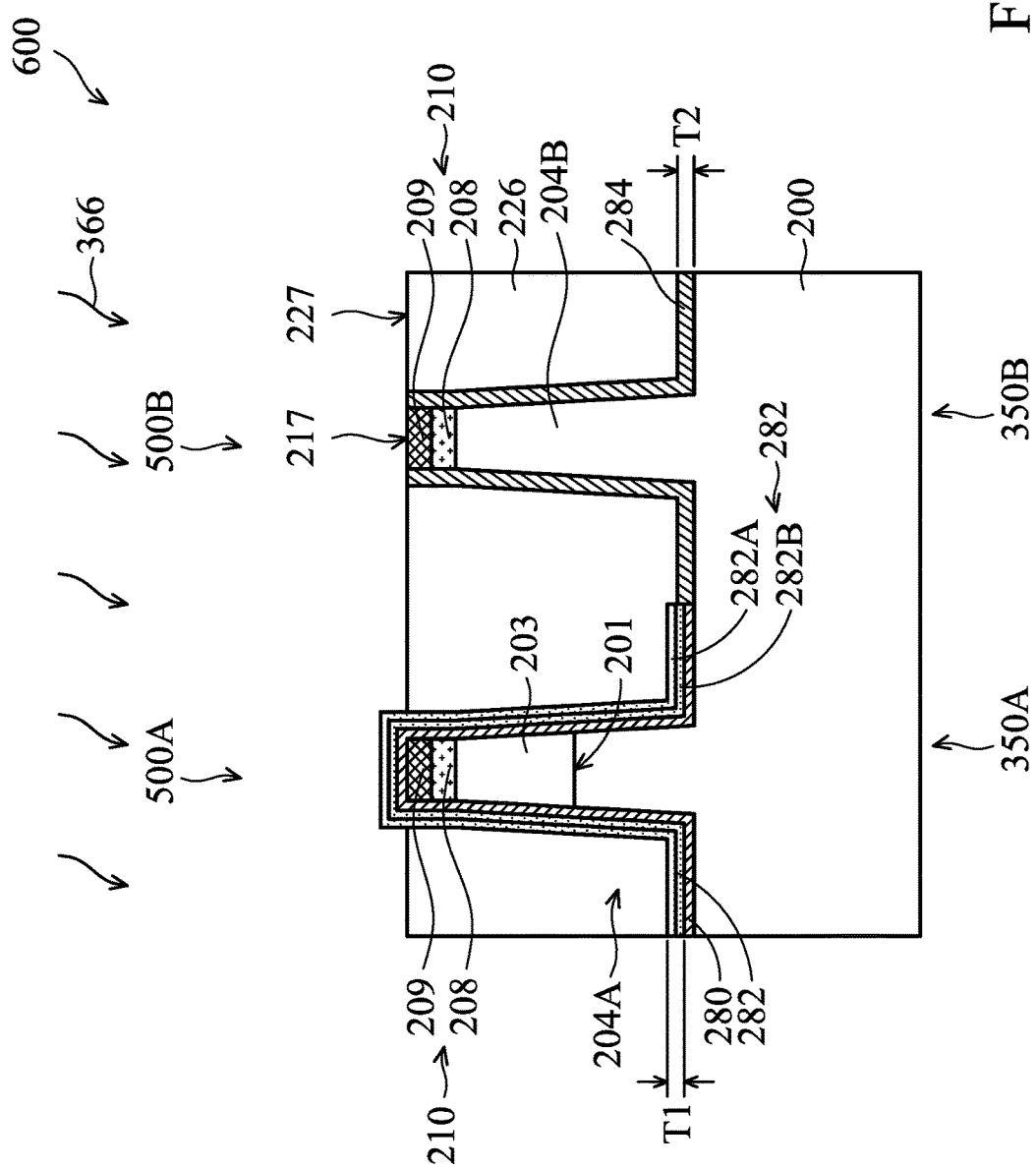

Afterwards, another anneal process 366 is performed on the insulation material 364 after removing portions of the insulation material 364, and the liner layer 284 over the top surfaces of the fin structures 204A and 204B, as shown in FIG. 12 in accordance with some embodiments. The anneal process 366 may help to further cure the insulation material 364. In addition, the anneal process 366 may be performed under the same conditions as the anneal process 364, and the details thereof are not repeated herein.

Figure 13:
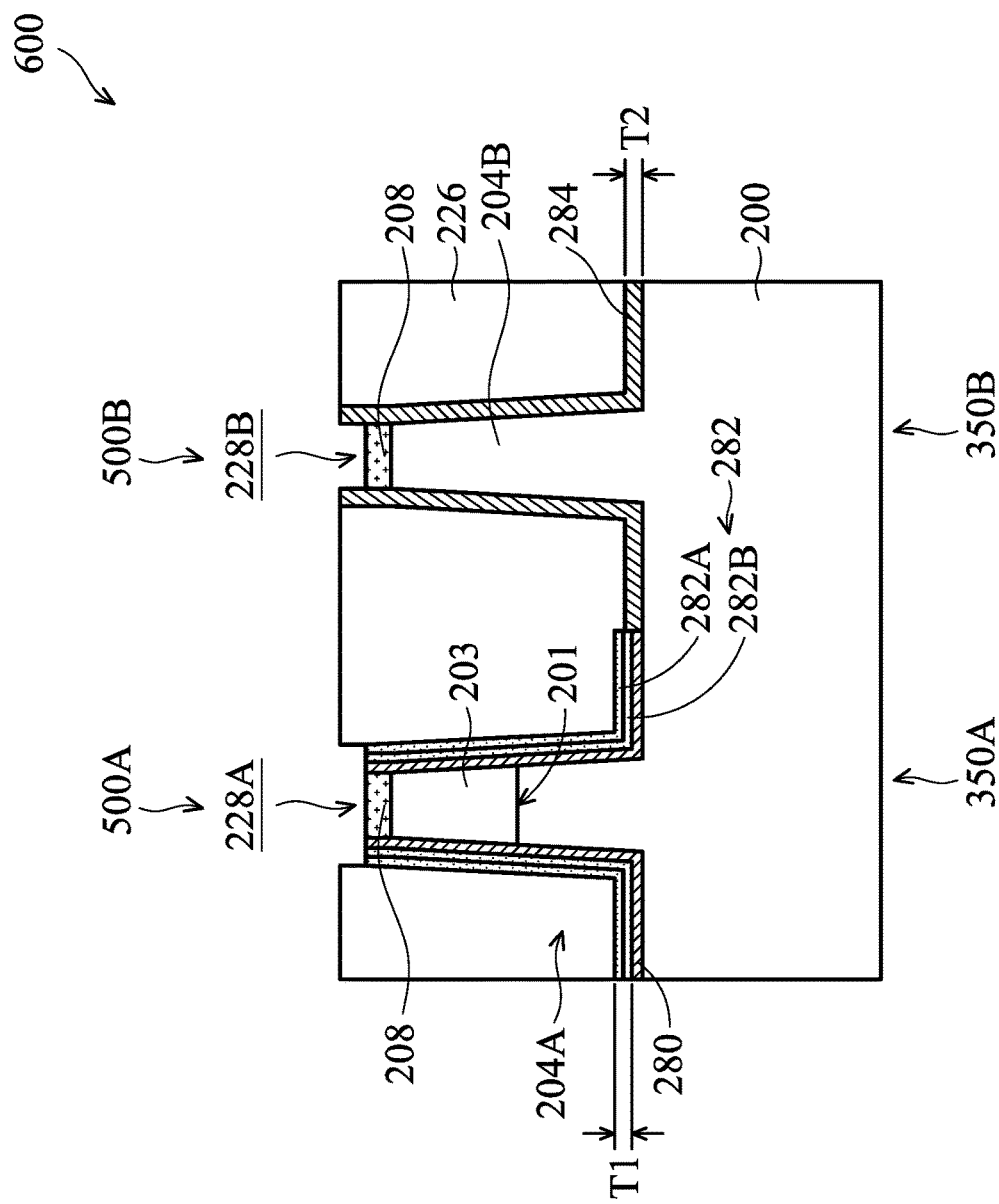

Afterward, the patterned pad nitrides 209 of the patterned masks 210 (FIG. 12) in the first region 350A and the second region 350B are removed by a removal process, as shown in FIG. 13 in accordance with some embodiments. In some embodiments, the etching process includes a wet etching process using phosphoric acid (e.g. $H_3PO_4$). Therefore, openings 228A and 228B are formed in the insulation material 364 exposing the top surfaces of the patterned pad oxides 208. In addition, the removal process removes portions of the semiconductor capping layer 280 and the liner layer 282 that over the top surface of the fin structure 204A in the first region 350A.

Figure 14:
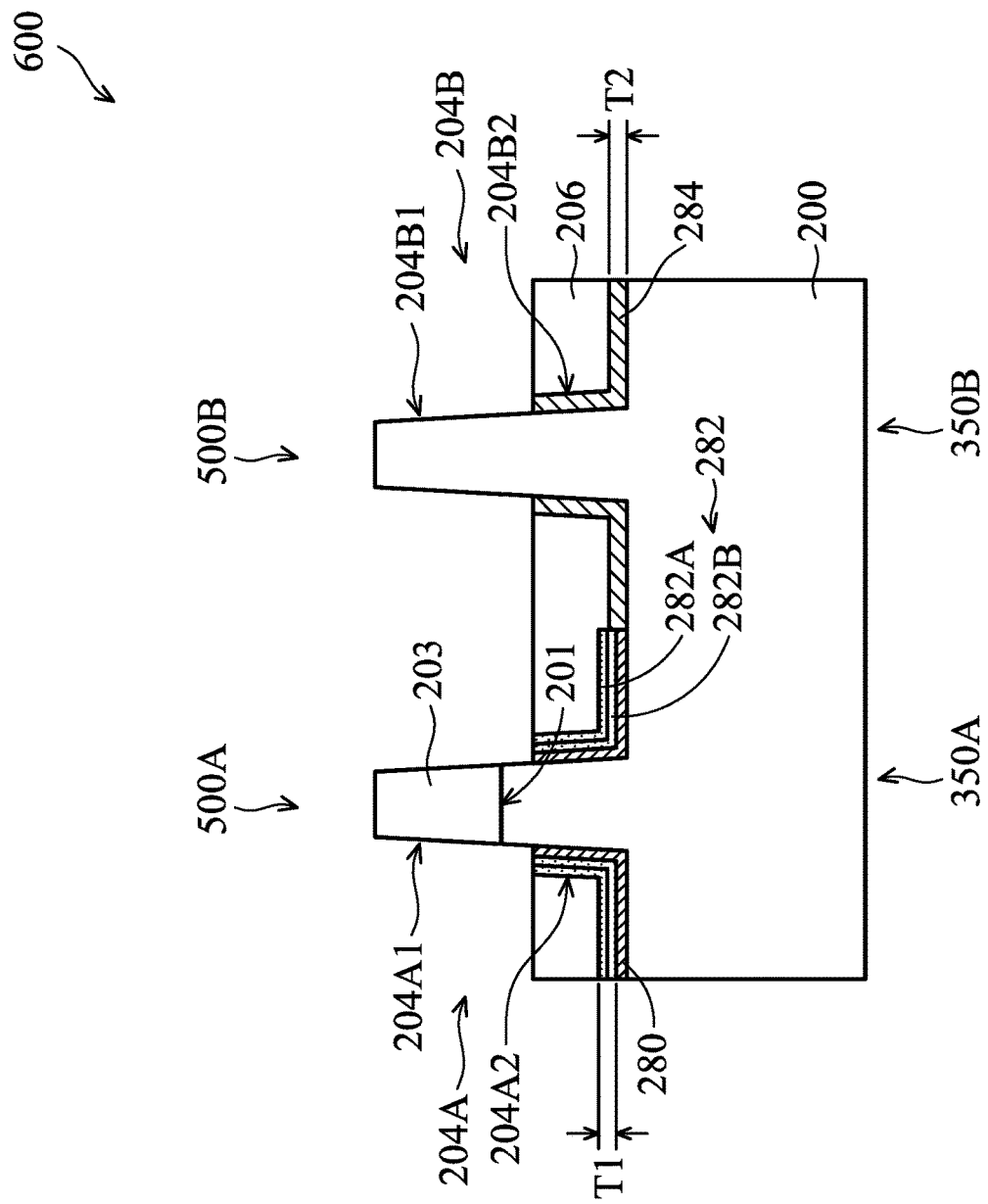

Afterward, the insulation material 364 is recessed to form isolation regions 206 such as shallow trench isolation (STI) regions, in the first region 350A and the second region 350B by an etching process, as shown in FIG. 14 in accordance with some embodiments. The isolation regions 206 are formed covering a lower portion 204A2 of the fin structure 204A and a lower portion 204B2 of the fin structure 204B and leaving an upper portion 204A1 of the fin structure 204A and an upper portion 204B1 of the fin structure 204B above the isolation regions 206. In addition, the etching process removes portions of the semiconductor capping layer 280 and the liner layer 282 over upper portion 204A1 of the fin structure 204A and an upper portion 204B1 of the fin structure 204B above the isolation regions 206. In some embodiments, the etching process includes a dry etching process using an etching gas comprising ammonia (e.g. $NH_3$) and hydrogen fluoride (HF).

Figure 15:
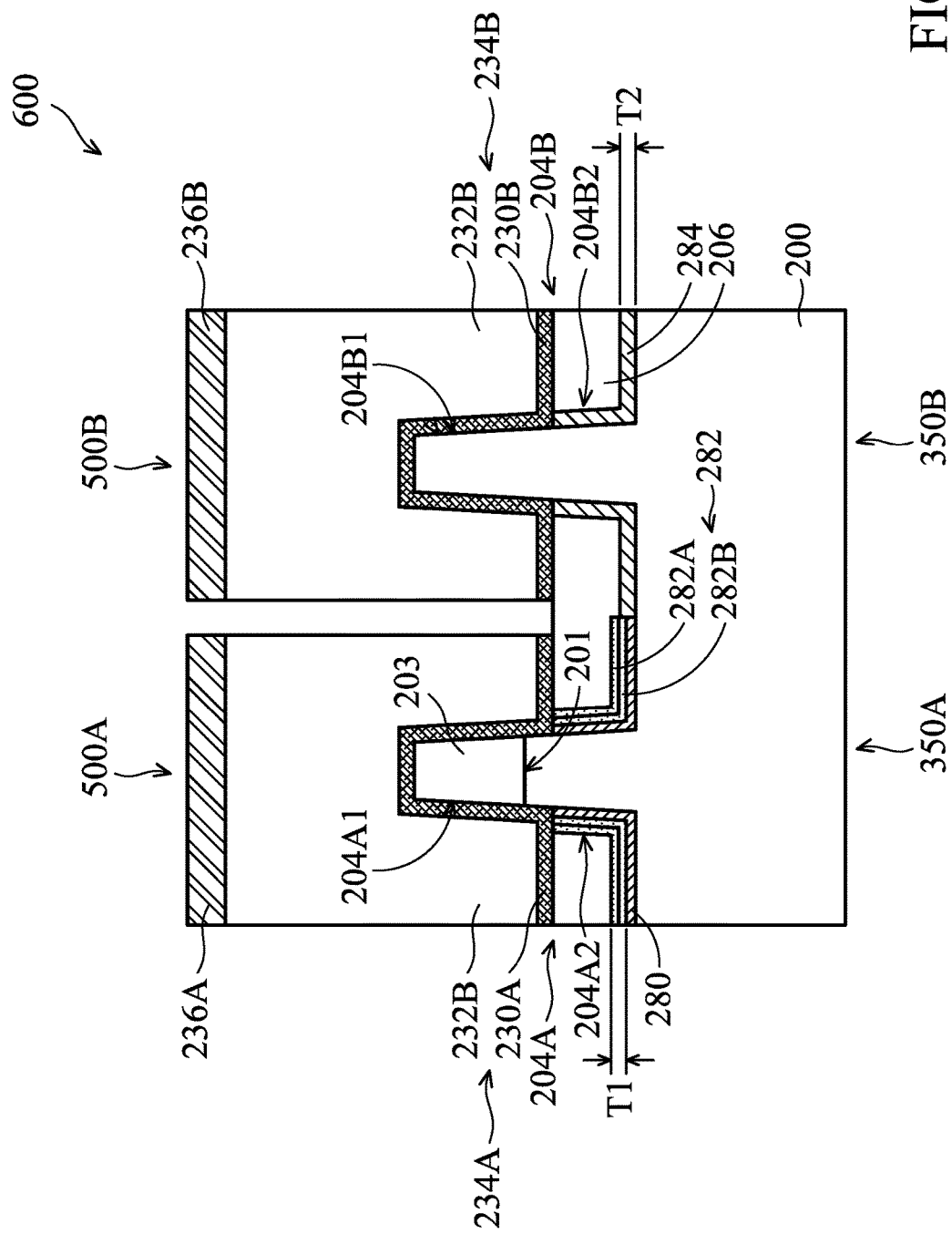

Afterward, dummy gate structures 234A and 234B are formed over channel regions of the fin structures 204A and 204B, respectively, as shown in FIG. 15 in accordance with some embodiments. The dummy gate structures 234A may include a gate dielectric 230A and a gate 232A overlying the gate dielectric 230A. Similarly, the dummy gate structures 234B may include a gate dielectric 230B and a gate 232B overlying the gate dielectric 230A. The dummy gate structures 234A and 234B may be formed by deposition processes and the subsequent patterning process using mask patterns 236A and 236B over dummy gate structures 234A and 234B.

The gate dielectrics 230A and 230B may be a high-k dielectric material having a dielectric constant (k) greater than about 7.0, and may include a metal oxide or a silicate of Hf, Al, Zr, La, Mg, Ba, Ti, Pb, multilayers thereof, and a combination thereof. In some embodiments, the gates 232A and 232B may include a metal-containing material such as TiN, TaN, TaC, Co, Ru, Al, a combination thereof, or multi-layers thereof. The mask patterns 236A and 236B may be formed of, for example, silicon nitride or the like.

FIGS. 16-18, 19A and 19B are cross-sectional views of various stages of a process for forming the FinFETs 500A and 500B of the FinFET structure 600 after performing the stage shown in FIG. 15. In some embodiments, the processes shown in FIGS. 16-18, 19A and 19B are performed for both the first region 350A (e.g. the PMOS region) and the second region 350B (e.g. the NMOS region), with some materials (e.g. dopants for source/drain regions, or work function layers of metal gates) adjusted to suit the type of devices (e.g. P-type FinFETs or N-type FinFETs) formed in the respective regions. For simplicity, one cross-sectional view along line B-B' of the fin structure 204A or along line C-C' of the fin structure 204B (instead of line B-B' of the fin structure 204A and along line C-C' of the fin structure 204B), is shown in each of FIGS. 16-18 and 19A.

Afterward, lightly doped drain (LDD) regions 240 are formed in the fin structure 204A (or 204B) by a plasma doping process, as shown in FIG. 16 in accordance with some embodiments. The fin structure 204A (or 204B) may include source/drain regions 244 and a channel region 242 between the source/drain regions 244. In some embodiments, the LDD regions 240 are positioned adjacent to the channel region 242 underlying the dummy gate structure 234A of the FinFET 500A (or the dummy gate structure 234B of the FinFET 500B). In addition, the LDD regions 240 may extend toward to source/drain regions 244 outside the channel region 242 of the FinFET 500A (or 500B).

The plasma doping process may implant N-type impurities (for N-type devices) in the fin structure 204A or P-type impurities (for P-type devices) in the fin structures 204A to form the LDD regions 240. For example, a patterned mask layer may be formed to shield the first region 350A (e.g. the PMOS region) while N-type impurities are implanted into the LDD regions 240 of the second region 350B (e.g. the NMOS region). Similarly, another patterned mask layer may be formed to shield the second region 350B (e.g. the NMOS region) while P-type impurities are implanted into the LDD regions 65 of the first region 350A (e.g. the PMOS region).

Afterward, gate spacers 218A (or 218B) are formed on opposite sidewalls of the dummy gate structure 234A (or 234B) and extend over the top surfaces of the in structure 204A (or 204B). Each of the gate spacers 218A (or 218B) may include a first gate spacer 246 and a second gate spacer 248 on the first gate spacer 246. The first gate spacer 246 may be formed of a nitride, such as silicon nitride, silicon oxynitride, silicon carbide, silicon carbonitride, the like, or a combination thereof, and may be formed using, e.g. a thermal oxidation, CVD, or other suitable deposition process. The second gate spacer 246 may be formed of silicon nitride, silicon carbonitride, a combination thereof, or the like using a suitable deposition method.

Afterward, source/drain features 222A (or 222B) are formed in the source/drain regions 244 of the fin structure 204A (or 204B), as shown in FIG. 17 in accordance with some embodiments. The source/drain features 222A (or 222B) are formed by etching the LDD regions 240 within the fin structure 204A (or 204B) to form recesses (not shown), and epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, the source/drain features 222B formed in the second region 350B (e.g. for the P-type FinFET 500A) includes silicon germanium (SiGe), and a p-type impurity such as boron or indium. In some embodiments, the source/drain features 222A formed in the first region 350A (e.g. for the N-type FinFET 500B) includes silicon carbide (SiC), silicon phosphorous (SiP), phosphorous-doped silicon carbon (SiCP), or the like.

Afterward, a dielectric layer (e.g. an interlayer dielectric (ILD) layer) 260 is formed over the fin structure 204A (or 204B), as shown in FIG. 18 in accordance with some embodiments. The dielectric layer 260 may be formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Afterward, a gate-last process (sometimes referred to as a replacement gate process) is performed, as shown in FIG. 18 in accordance with some embodiments. In a gate-last process, the gate dielectric 230A (or 230B) and the gate 232A (or 232B) of the dummy gate structures 234A (or 234B) (FIG. 16) are removed to form a recess between the gate spacers 218A (or 218B) by an etching process and replaced with the gate structure 215A (or 215B) by a deposition process and a subsequent planarization process. The gate structure 215A (or 215B) includes a gate dielectric layer 264, a barrier layer 276, a seed layer 277 and a gate electrode 270.

In some embodiments, the gate dielectric layer 264 includes silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layer 264 may include MBD, ALD, PECVD, and the like.

In some embodiments, the barrier layer 276 includes an electrically conductive material such as titanium nitride, although other materials, such as tantalum nitride, titanium, tantalum, or the like, may alternatively be utilized. The barrier layer 276 may be formed using a CVD process, such as plasma-enhanced CVD (PECVD).

In some embodiments, work function layers may be formed in the gate structure 215A (or 215B). For example, P-type work function layer(s) may be formed in the first region 350A, and N-type work function layer(s) may be formed in the second region 350B. The P-type work function layer may include TiN, TaN, Ru, Mo, Al, WN, $ZrSi_2$, $MoSi_2$, $TaSi_2$, $NiSi_2$, WN, other suitable P-type work function materials, or a combination thereof. The N-type work function layer may include Ti, Ag, TaAl, TaAlC, TiAlN, TaC, TaCN, TaSiN, Mn, Zr, other suitable N-type work function materials, or a combination thereof.

In some embodiments, the seed layer 277 is formed over the barrier layer 94 (or the work function layers if formed). The seed layer 277 may include copper (Cu), titanium (Ti), tantalum (Ta), titanium nitride (TiN), tantalum nitride (TaN), the like, or a combination thereof, and may be deposited by atomic layer deposition (ALD), sputtering, physical vapor deposition (PVD), or the like.

In some embodiments, the gate electrode 270 may be made of a metal-containing material such as TiN, TaN, TaC, Co, Ru, Al, combinations thereof, or multi-layers thereof, and may be formed by, e.g., electroplating, electroless plating, or other suitable method.

Afterward, a dielectric layer (e.g. an inter-metal dielectric (IMD) layer) 264 is formed over the dielectric layer 260 and the gate structure 215A (or 215B) by a deposition process that is similar to or the same as the deposition process for forming the dielectric layer 260, as shown in FIGS. 19A and 19B in accordance with some embodiments.

Afterward, silicide regions 262 are formed over the source/drain features 222A (or 222B) by an etching process, a deposition process and a thermal anneal process. In some embodiments, the etching process is performed to form openings (not shown) that expose the source/drain features 220A (or 220B). The deposition process is performed to form a metal capable of reacting with semiconductor materials (e.g. silicon, germanium) to form silicide or germanide regions in the openings. The thermal anneal process is performed so that the deposited metal reacts with the source/drain features 222A (or 222B) to form the silicide regions 262. After the thermal anneal process, the unreacted metal is removed.

Afterward, contact plugs 290 are formed filling the openings (not shown) that expose the gate electrode 270 and the source/drain features 220A (or 220B) by deposition processes and a subsequent a planarization process such as CMP. In some embodiments, each of the contact plugs 290 includes a barrier layer 276, a seed layer 277 and a conductive material 278. The barrier layer 276 may comprise an electrically conductive material such as titanium (Ti), titanium nitride (TiN), tantalum (Ta), tantalum nitride (TaN), or the like, and may be formed using a CVD process, such as plasma-enhanced CVD (PECVD). The seed layer 277 may be deposited by PVD, ALD or CVD, and may be formed of tungsten, copper, or copper alloys. The conductive material 278 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating).

After performing the aforementioned processes, the FinFET 500A is formed over the fin structure 204A in the first region 350A and the FinFET 500B is formed over the fin structure 204B in the second region 350B. Moreover, a semiconductor structure 600 including the FinFET 500A (e.g. the P-type FinFET) and the FinFET 500B (e.g. the N-type FinFET) is formed, as shown in FIGS. 19A and 19B in accordance with some embodiments.

In FIGS. 19A and 19B, the gate structure 215A is formed over the fin structure 204A, and the gate structure 215B separated from the gate structure 215A by the dielectric layer 260 is formed over the fin structure 204B. The contact plugs 290 are electrically coupled to the gate structures 215A and 215B. The liner layer 282 is positioned between the lower portion of the fin structure 204A and the isolation regions 206 in the first region 350A. The liner layer 284 is positioned between the lower portion of the fin structure 204B and the isolation regions 206 in the second region 350B. In addition, the isolation region 206 (e.g. the middle one of the isolation region 206) between the fin structures 204A and 204B, which is configured to separate the fin structure 204A form the fin structure 204B, which is surrounded by both the first liner layer and the second liner layer, is surrounded by both the liner layer 282 and the liner layer 284.

Embodiments of a fin field-effect transistor (FinFET) structure (e.g. the FinFET structure 600 including the FinFET 500A and the FinFET 500B) and a method for forming the same are provided. The FinFET structure 600 includes a first fin structure (e.g. the fin structure 204A) that protrudes from a first region 350A of a substrate 200. A second fin structure (e.g. the fin structure 204B) protrudes from a second region of the substrate. Isolation regions 206 covers a lower portion 204A2 of the first fin structure and a lower portion 204B2 of the second fin structure and leaves an upper portion 204A1 of the first fin structure and an upper portion 204B1 of the second fin structure above the isolation regions. A first liner layer (e.g. the liner layer 282) is positioned between the lower portion of the first fin structure and the isolation regions in the first region. A second liner layer (e.g. the liner layer 284) covers the lower portion of the second fin structure and is positioned between the second fin structure and the isolation regions in the second region. The first liner layer and the second liner layer are formed of different materials. In some embodiments, the liner layer 284 on the fin structure 204B formed of silicon in the second region 350B (e.g. the NMOS region) may be formed of an oxide-containing material, such as silicon oxide. The amount of positive charges of the liner layer 284 can be much less than that of the liner layer 282 in the first region 350A (e.g. the PMOS region), which is formed of a nitride-containing material, such as silicon nitride. Therefore, the FinFET 500B (e.g. the N-type FinFET) including a STI oxide liner (e.g. the liner layer 284) on the silicon fin structure 204B may be free from the problems of abnormal turn-on and the short channel effect (SCE).

Embodiments of a fin field-effect transistor (FinFET) structure and a method for forming the same are provided. The FinFET structure includes a first fin structure that protrudes from a first region of a substrate. A second fin structure protrudes from a second region of the substrate. Isolation regions cover a lower portion of the first fin structure and a lower portion of the second fin structure and leave an upper portion of the first fin structure and an upper portion of the second fin structure above the isolation regions. A first liner layer is positioned between the lower portion of the first fin structure and the isolation regions in the first region. A second liner layer covers the lower portion of the second fin structure and is positioned between the second fin structure and the isolation regions in the second region. The first liner layer and the second liner layer are formed of different materials. In some embodiments, the N-type FinFET includes a silicon oxide liner on the silicon fin structure. The amount of positive charges of the silicon oxide liner can be much less than that of the nitride liner. Therefore, the N-type FinFET may be free from the problems of abnormal turn-on and the short channel effect (SCE).

In some embodiments, a FinFET structure is provided. The FinFET structure includes a first fin structure that protrudes from a first region of a substrate. A second fin structure protrudes from a second region of the substrate. Isolation regions cover a lower portion of the first fin structure and a lower portion of the second fin structure and leave an upper portion of the first fin structure and an upper portion of the second fin structure above the isolation regions. A first liner layer is positioned between the lower portion of the first fin structure and the isolation regions in the first region. A second liner layer covers the lower portion of the second fin structure and is positioned between the second fin structure and the isolation regions in the second region. The first liner layer and the second liner layer are formed of different materials.

In some embodiments, a FinFET structure is provided. The FinFET structure includes a first fin structure comprising silicon germanium is positioned in a first region of a substrate. A second fin structure formed of silicon is positioned in a second region of the substrate. An isolation region covers a lower portion of the first fin structure and a lower portion of the second fin structure and leaves an upper portion of the first fin structure and an upper portion of the second fin structure above the isolation regions. A first liner layer formed of a nitride-containing material covers the lower portion of the first fin structure, so that the first fin structure is separated from the isolation region through the first liner layer. A second liner layer formed of an oxide-containing material covers the lower portion of the second fin structure so that the second fin structure is separated from the isolation region through the second liner layer.

In some embodiments, a method for forming a FinFET structure is provided. The method includes forming a first fin structure in a first region of a substrate and a second fin structure in a second region of a substrate. The method includes forming a semiconductor capping layer over the first fin structure and the second fin structure. The method also includes forming a first liner layer over the semiconductor capping layer in the first region and a second region. The method further includes removing first liner layer in the second region. The method further includes forming a second liner layer over the second fin structure. The method further includes forming isolation regions covering a lower portion of the first fin structure and a lower portion of the second fin structure and leaving an upper portion of the first fin structure and an upper portion of the second fin structure above the isolation regions. The method further includes forming a first gate structure over the first fin structure. The method further includes forming a second gate structure over the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field-effect transistor (FinFET) structure, comprising:
    a first fin structure protruding from a first region of a substrate;
    a second fin structure protruding from a second region of the substrate;
    isolation regions covering a lower portion of the first fin structure and a lower portion of the second fin structure and leaving an upper portion of the first fin structure and an upper portion of the second fin structure above the isolation regions;
    a first liner layer between the lower portion of the first fin structure and the isolation regions in the first region; and
    a second liner layer covering the lower portion of the second fin structure and between the second fin structure and the isolation regions in the second region,
    wherein the first liner layer and the second liner layer are formed of different materials, and the first liner layer and the second liner layer are in direct physical contact with the isolation regions.

2. The FinFET structure as claimed in claim 1, wherein the first region is a PMOS region and the second region is an NMOS region.

3. The FinFET structure as claimed in claim 2, wherein a portion of the first fin structure is formed of silicon germanium, and the second fin structure is formed of silicon.

4. The FinFET structure as claimed in claim 3, wherein the first liner layer is formed of a nitride-containing material, the second liner layer is formed of an oxide-containing material.

5. The FinFET structure as claimed in claim 1, wherein the first fin structure is positioned beside the second fin structure, and the first and second fin structures are separated from each other through one of the isolation regions, which is surrounded by both the first liner layer and the second liner layer.

6. The FinFET structure as claimed in claim 1, wherein each of the first fin structure and the second fin structure comprises source/drain regions and a channel region between the source/drain regions, the FinFET structure further comprising:
 a first gate structure over the channel region of the first fin structure in the first region;
 first gate spacers on opposite sidewalls of the first gate structure;
 first source/drain features in the source/drain regions of the first fin structure and adjacent to outer sidewalls of the first gate spacers;
 a second gate structure over the channel region of the second fin structure in the second region;
 second gate spacers on opposite sidewalls of the second gate structure; and
 second source/drain features in the source/drain regions of the second fin structure and adjacent to outer sidewalls of the second gate spacers.

7. A Fin Field-Effect Transistor (FinFET) structure, comprising:
 a first fin structure comprising silicon germanium in a first region of a substrate;
 a second fin structure formed of silicon in a second region of the substrate;
 an isolation region covering a lower portion of the first fin structure and a lower portion of the second fin structure and leaving an upper portion of the first fin structure and an upper portion of the second fin structure above the isolation regions;
 a first liner layer formed of a nitride-containing material covering the lower portion of the first fin structure, so that the first fin structure is separated from the isolation region through the first liner layer; and
 a second liner layer formed of an oxide-containing material covering the lower portion of the second fin structure so that the second fin structure is separated from the isolation region through the second liner layer, wherein the first liner layer is formed without overlapping the second liner layer in the second region.

8. The FinFET structure as claimed in claim 7, wherein the first fin structure is separated from the first liner layer through a semiconductor capping layer covering the lower portion of the first fin structure.

9. The FinFET structure as claimed in claim 7, wherein the first region is a PMOS region and the second region is an NMOS region.

10. The FinFET structure as claimed in claim 7, wherein the isolation region is surrounded by both the first liner layer and the second liner layer.

11. The FinFET structure as claimed in claim 7, wherein each of the first fin structure and the second fin structure comprises source/drain regions and a channel region between the source/drain regions, the FinFET structure further comprising:
 a first gate structure over the channel region of the first fin structure in the first region;
 first gate spacers on opposite sidewalls of the first gate structure;
 first source/drain features in the source/drain regions of the first fin structure and adjacent to outer sidewalls of the first gate spacers;
 a second gate structure over the channel region of the second fin structure in the second region;
 second gate spacers on opposite sidewalls of the second gate structure; and
 second source/drain features in the source/drain regions of the second fin structure and adjacent to outer sidewalls of the second gate spacers.

12. A method for forming a fin field-effect transistor (FinFET) structure, comprising:
 forming a first fin structure in a first region of a substrate and a second fin structure in a second region of the substrate;
 forming a semiconductor capping layer over the first fin structure and the second fin structure;
 forming a first liner layer over the semiconductor capping layer in the first region and the second region;
 forming a mask layer to cover the first liner layer in the first region;
 removing the first liner layer in the second region;
 forming a second liner layer over the second fin structure;
 removing the mask layer after the second liner layer is formed;
 forming isolation regions covering a lower portion of the first fin structure and a lower portion of the second fin structure and leaving an upper portion of the first fin structure and an upper portion of the second fin structure above the isolation regions;
 forming a first gate structure over the first fin structure; and
 forming a second gate structure over the second fin structure.

13. The method for forming a FinFET structure as claimed in claim 12, wherein forming the first fin structure and forming the second fin structure comprises:
 removing a portion of the substrate comprising silicon in the first region;
 epitaxially growing a semiconductor material comprising silicon germanium in the first region; and
 forming trenches in the semiconductor material in the first region and in the substrate in the second region, wherein the first fin structure and the second fin structure are formed between the trenches.

14. The method for forming a FinFET structure as claimed in claim 12, wherein forming the isolation regions comprises:
 forming an insulation material over the first fin structure and the second fin structure;
 removing the insulation material, the first liner layer, the second liner layer and the semiconductor capping layer over a top surface of the first fin structure and a top surface of the second fin structure;
 removing the insulation material, the first liner layer, the second liner layer and the semiconductor capping layer covering the upper portion of the first fin structure and the upper portion of the second fin structure.

15. The method for forming a FinFET structure as claimed in claim 14, further comprising:
 performing a first anneal process after forming the insulation material over the first fin structure and the second fin structure; and
 performing a second anneal process after removing the insulation material, the second liner layer over the top surface of the first fin structure and a top surface of the second fin structure.

16. The method for forming a FinFET structure as claimed in claim 15, wherein performing each of the first anneal process and the second anneal process comprises:
 performing a wet steam anneal process; and performing a dry anneal process after the wet steam anneal process.

17. The method for forming a FinFET structure as claimed in claim 16, wherein the dry anneal process is performed in an ambient atmosphere comprising nitrogen.

18. The method for forming a FinFET structure as claimed in claim 12, wherein each of the first fin structure and the second fin structure comprises source/drain regions and a channel region between the source/drain regions, the method further comprising:

forming a first gate structure over the channel region of the first fin structure in the first region;

forming first gate spacers on opposite sidewalls of the first gate structure;

forming first source/drain features in the source/drain regions and adjacent to outer sidewalls of the first gate spacers;

forming a second gate structure over the channel region of the second fin structure in the second region;

forming second gate spacers on opposite sidewalls of the second gate structure; and forming second source/drain features in the second source/drain regions of the second fin structure and adjacent to outer sidewalls of the second gate spacers.

19. The FinFET structure as claimed in claim 1, wherein the first liner layer is formed without overlapping the second liner layer in the second region.

20. The FinFET structure as claimed in claim 1, wherein a semiconductor capping layer between the lower portion of the first fin structure and the first liner layer in the first region, wherein a bottommost surface of the semiconductor capping layer is level with a bottommost surface of the second liner layer.

* * * * *